United States Patent
Shibata et al.

(10) Patent No.: US 7,394,691 B2
(45) Date of Patent: Jul. 1, 2008

(54) SEMICONDUCTOR MEMORY DEVICE WHICH PREVENTS DESTRUCTION OF DATA

(75) Inventors: Noboru Shibata, Kawasaki (JP); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 11/498,142

(22) Filed: Aug. 3, 2006

(65) Prior Publication Data
US 2007/0035997 A1  Feb. 15, 2007

(30) Foreign Application Priority Data
Aug. 12, 2005  (JP)  ............... 2005-234719

(51) Int. Cl.
*G11C 11/34* (2006.01)
*G11C 7/00* (2006.01)
*G11C 29/00* (2006.01)

(52) U.S. Cl. .................. 365/185.09; 365/185.24; 365/2; 714/773

(58) Field of Classification Search .......... 365/185.09, 365/185.11, 185.12, 185.17, 185.22, 185.24, 365/185.29, 185.33, 200, 225.7; 714/773
See application file for complete search history.

(56) References Cited

U.S. PATENT DOCUMENTS

| | | | |
|---|---|---|---|
| 4,939,694 A * | 7/1990 | Eaton et al. | 365/200 |
| 5,379,262 A * | 1/1995 | Okamoto et al. | 365/185.09 |
| 5,406,529 A * | 4/1995 | Asano | 365/185.11 |
| 5,734,816 A * | 3/1998 | Niijima et al. | 365/185.29 |
| 6,119,245 A * | 9/2000 | Hiratsuka | 365/185.09 |
| 6,178,115 B1 | 1/2001 | Shibata et al. | |
| 6,377,485 B1 | 4/2002 | Shibata et al. | |
| 6,487,122 B2 | 11/2002 | Shibata et al. | |
| 6,552,930 B2 | 4/2003 | Shibata et al. | |
| 6,600,676 B2 * | 7/2003 | Shibata et al. | 365/185.09 |
| 6,625,061 B2 * | 9/2003 | Higuchi | 365/185.09 |
| 6,657,891 B1 | 12/2003 | Shibata et al. | |
| 6,876,578 B2 | 4/2005 | Shibata et al. | |

(Continued)

FOREIGN PATENT DOCUMENTS

| JP | 2000-195280 | 7/2000 |
|---|---|---|
| JP | 2004-192789 | 7/2004 |

OTHER PUBLICATIONS

U.S. Appl. No. 11/776,037, filed Jul. 11, 2007, Sukegawa et al.

*Primary Examiner*—Trong Phan
(74) *Attorney, Agent, or Firm*—Oblon, Spivak, McClelland, Maier & Neustadt, P.C.

(57) ABSTRACT

A plurality of memory cells each storing n values (n is a natural number which is not smaller than 3) are arranged in a matrix form in a memory cell array, and each memory cell is connected with a word line and a bit line. Each memory cell stores the n-valued data by a first write operation and a second write operation. A read section sets a potential of a word line, and reads data from a memory cell in the memory cell array. If data read by the read section and written in the second write operation includes an uncorrectable error, a control section changes a potential of a word line supplied to the read section when reading data written in the first write operation.

20 Claims, 16 Drawing Sheets

U.S. PATENT DOCUMENTS

| | | |
|---|---|---|
| 6,925,004 B2 | 8/2005 | Shibata et al. |
| 6,937,512 B2 * | 8/2005 | Shibata et al. ......... 365/185.09 |
| 7,061,804 B2 * | 6/2006 | Chun et al. ............ 365/185.17 |
| 7,106,627 B2 * | 9/2006 | Shibata et al. ......... 365/185.09 |
| 7,224,607 B2 * | 5/2007 | Gonzalez et al. ....... 365/185.11 |
| 7,245,528 B2 * | 7/2007 | Shibata et al. ......... 365/185.22 |
| 7,295,469 B2 * | 11/2007 | Shibata et al. ......... 365/185.09 |
| 2007/0035997 A1 | 2/2007 | Shibata et al. |

* cited by examiner

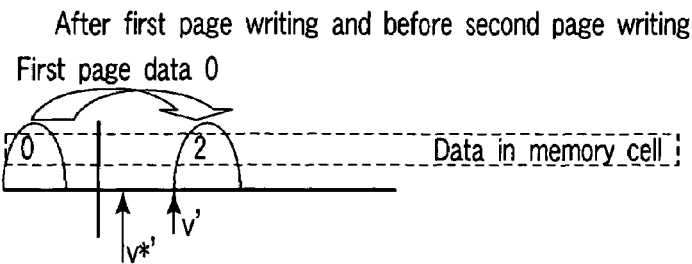
FIG. 2A  After first page writing and before second page writing
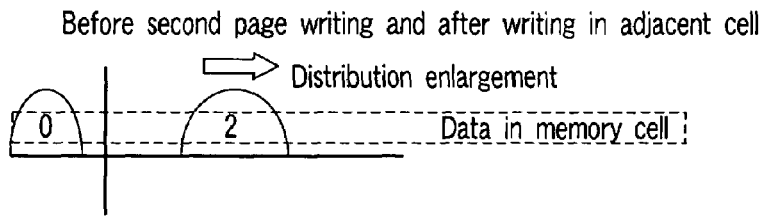
FIG. 2B  Before second page writing and after writing in adjacent cell
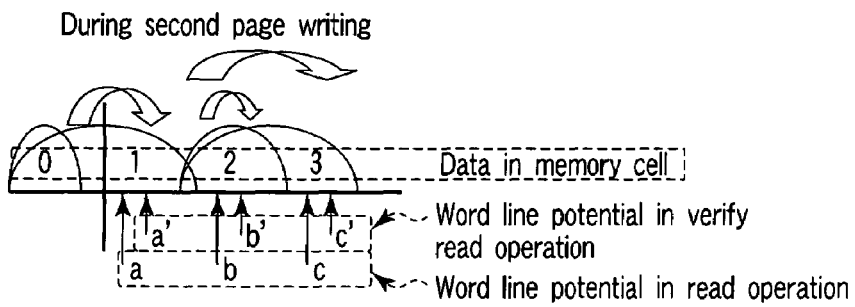
FIG. 2C  During second page writing
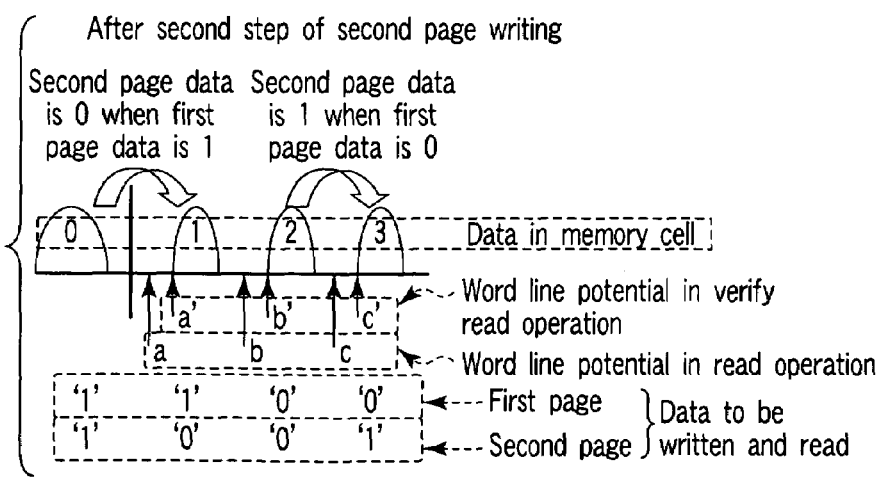
FIG. 2D  After second step of second page writing

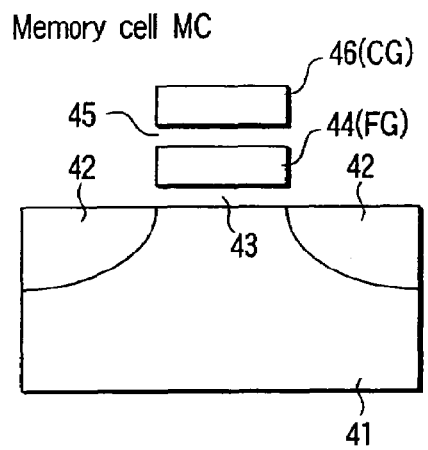
F I G. 5A
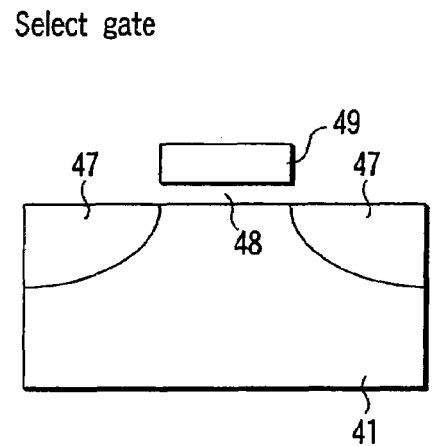
F I G. 5B
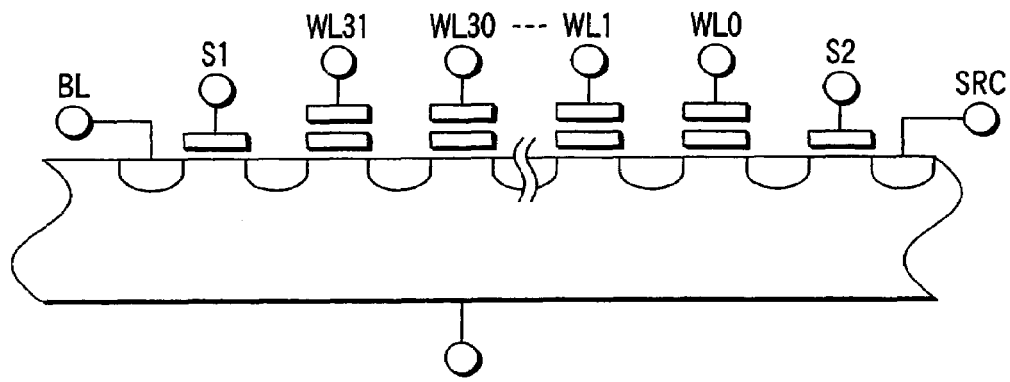
F I G. 6

(Data load, after internal read operation)

| | Data in memory cell after writing | | | | |
|---|---|---|---|---|---|
| | 0 | 1 | 2 | 3 | |
| SDC | 0 | 0 | 1 | 0 | Data to be written and read which are input from outside |
| PDC | 0 | 0 | 0 | 1 | Data to be read by internal read operation |

FIG. 11A (After setting data cache First time)

| | Data in memory cell after writing | | | | |
|---|---|---|---|---|---|
| | 0 | 1 | 2 | 3 | |
| SDC | 1 | 1 | 0 | 0 | Used for verifying memory cell data 1 |
| DDC | 1 | 0 | 1 | 0 | Used for verifying memory cell data 2 |
| DDCQ | 1 | 1 | 0 | 0 | 1: Writing is not selected, 0: writing in lower verify level |
| PDC | 1 | 1 | 0 | 0 | 1: Writing is not selected, 0: writing |

FIG. 11B (After first step of second page writing)

| | Data in memory cell after writing | | | | |
|---|---|---|---|---|---|
| | 0 | 1 | 2 | 3 | |
| SDC | 1 | 1 | 0 | 0 | Used for verifying memory cell data 1 |
| DDC | 1 | 0 | 1 | 0 | Used for verifying memory cell data 2 |
| DDCQ | 1 | 1 | 1 | 1 | 1: Writing is not selected, 0: writing in lower verify level |
| PDC | 1 | 1 | 1 | 1 | 1: Writing is not selected, 0: writing |

FIG. 12A (After setting data cache Second time)

| | Data in memory cell after writing | | | | |
|---|---|---|---|---|---|
| | 0 | 1 | 2 | 3 | |
| SDC | 1 | 1 | 0 | 0 | Used for verifying memory cell data 1 |
| DDC | 1 | 0 | 1 | 0 | Used for verifying memory cell data 2 |
| DDCQ | 1 | 0 | 0 | 0 | 1: Writing is not selected, 0: writing in lower verify level |
| PDC | 1 | 0 | 1 | 0 | 1: Writing is not selected, 0: writing |

FIG. 12B (After second step of second page writing)

| | Data in memory cell after writing | | | | |
|---|---|---|---|---|---|
| | 0 | 1 | 2 | 3 | |
| SDC | 1 | 1 | 0 | 0 | Used for verifying memory cell data 1 |
| DDC | 1 | 0 | 1 | 0 | Used for verifying memory cell data 2 |
| DDCQ | 1 | 1 | 1 | 1 | 1: Writing is not selected, 0: writing in lower verify level |
| PDC | 1 | 1 | 1 | 1 | 1: Writing is not selected, 0: writing |

FIG. 13A (After setting data cache high-speed writing)

| | Data in memory cell after writing | | | | |
|---|---|---|---|---|---|
| | 0 | 1 | 2 | 3 | |
| SDC | 1 | 1 | 0 | 0 | Used for verifying memory cell data 1 |
| DDC | 1 | 0 | 0 | 0 | Used for verifying memory cell data 2 |
| DDCQ | 1 | 0 | 0 | 0 | 1: Writing is not selected, 0: writing in lower verify level |
| PDC | 1 | 0 | 0 | 0 | 1: Writing is not selected, 0: writing |

FIG. 13B

SEMICONDUCTOR MEMORY DEVICE WHICH PREVENTS DESTRUCTION OF DATA

CROSS-REFERENCE TO RELATED APPLICATIONS

This application is based upon and claims the benefit of priority from prior Japanese Patent Application No. 2005-234719, filed Aug. 12, 2005, the entire contents of which are incorporated herein by reference.

BACKGROUND OF THE INVENTION

1. Field of the Invention

The present invention relates to a NAND flash memory using, e.g., an EEPROM, and more particularly to a semiconductor memory device capable of storing multivalued data in a single memory cell.

2. Description of the Related Art

In a NAND flash memory, a plurality of memory cells arranged in a column direction are connected in series to constitute a NAND cell, and each NAND cell is connected with a corresponding bit line through a select gate. Each bit line is connected with a latch circuit which latches write data and read data. There has been proposed a non-volatile semiconductor memory device capable of storing multivalued data in this NAND flash memory (see, e.g., Jpn. Pat. Appln. KOKAI Publication No. 2000-195280).

In recent years, miniaturization of an element has advanced, and a distance between cells is decreasing. Therefore, an influence of a floating gate capacity between cells adjacent to each other is becoming large. Specifically, there has arisen a problem that a threshold voltage of a cell in which data has been previously written fluctuates due to a threshold voltage of a cell which is adjacent to the former cell and in which data is subsequently written. In particular, since a multivalued memory which stores a plurality of sets of data each consisting of two or more bits in a single cell stores a plurality of sets of data by using a plurality of threshold voltages, a distribution of a threshold voltage corresponding to one set of data must be controlled to be extremely narrowed. Therefore, the influence of the threshold voltage of the adjacent cell is prominent.

In order to solve this problem, in a memory cell in which one-bit (a first page) data is stored, one-bit (the first page) data is written in an adjacent memory cell to reach a threshold voltage (a V-level) lower than an original threshold voltage before storing the next data. After writing the data in this adjacent memory cell, writing to increase the voltage to the original threshold voltage (a word line potential "b" (V<=B)) is carried out in writing a second page. However, it is hard to recognize that data of the first page has been written with to the original threshold voltage or the lower threshold voltage before and after writing the second page. Therefore, in order to recognize this, there has been proposed a write scheme by which a flag memory cell (which will be referred to as a flag cell) is prepared in accordance with each page and a read operation is performed in accordance with data in this flag cell (see, e.g., Jpn. Pat. Appln. KOKAI Publication No. 2004-192789).

In a case where data of the second page is written based on this write scheme, when data of the first page is "1" and data of the second page is "0", data in the memory cell is changed from "0" to "1", a threshold voltage is increased to, e.g., a level A. Further, when data of the first page is "0", its threshold voltage is determined as a voltage including the level A. Therefore, their threshold voltage distributions overlap each other. Therefore, when writing is interrupted due to, e.g., an abnormal cutoff of a power supply during writing the second page, there occurs a problem that the previously written first page data is also destroyed. Therefore, there has been demanded a semiconductor memory device which can avoid destruction of data of the first page even if writing the second page is abnormally interrupted.

BRIEF SUMMARY OF THE INVENTION

According to a first aspect of the invention, there is provided a semiconductor memory device comprising: a memory cell array in which a plurality of memory cells are arranged in a matrix form, each memory cell being connected with a word line and a bit line and storing n values (n is a natural number which is not smaller than 3); a write section which writes n-valued data in the memory cell in which k values (k<n) are stored; a read section which sets a potential of the word line to read data from the memory cell in the memory cell array; and a control section which changes a potential of the word line supplied to the read section at the time of reading the k-valued data when an uncorrectable error is included in the data read by the read section.

According to a second aspect of the invention, there is provided a semiconductor memory device comprising: a memory cell which stores n values (n is a natural number which is not smaller than 3); and a control portion which controls the memory cell, wherein the control portion sets a threshold voltage of the memory cell from a first threshold voltage to the first threshold voltage or a second threshold voltage (the first threshold voltage<the second threshold voltage) by a first write operation, it sets the threshold voltage of the memory cell to a third threshold voltage (the second threshold voltage≦the third threshold voltage) or above by a second write operation when the threshold voltage of the memory cell is the second threshold voltage, and it sets the threshold voltage of the memory cell to the first threshold voltage or a fourth threshold voltage (the first threshold voltage<the fourth threshold voltage) by a third write operation when the threshold voltage of the memory cell is the first threshold voltage.

According to a third aspect of the present invention, there is provided a semiconductor memory device comprising: a memory cell which stores n values (n is a natural number which is not smaller than 3); a first flag memory cell; a second flag memory cell; and a control portion which controls the memory cell and the first and second flag memory cells, wherein the control portions sets a threshold voltage of the memory cell from a first threshold voltage to the first threshold voltage to a second threshold voltage (the first threshold voltage<the second threshold voltage) by a first write operation, it sets the threshold voltage of the memory cell to a third threshold voltage (the second threshold voltage≦the third threshold voltage) or above and writes data in the second flag memory cell to achieve the third threshold voltage by a second write operation when the threshold voltage of the memory cell is the second threshold voltage, it performs writing to achieve the threshold voltage of the memory cell as the first threshold voltage or a fourth threshold voltage (the first threshold voltage<the fourth threshold voltage) by a third write operation when the threshold voltage of the memory cell is the first threshold voltage, and it performs writing to set the threshold voltage of the memory cell to a fifth threshold voltage and performs writing in the first flag memory cell to set the fourth threshold voltage when the threshold voltage of the memory cell is the third threshold voltage.

BRIEF DESCRIPTION OF THE SEVERAL VIEWS OF THE DRAWING

FIGS. 2A to 2D are views showing a relationship between data in a memory cell and a threshold voltage of the memory cell according to the related art;

FIGS. 5A and 5B are cross-sectional views showing a memory cell and a selection transistor;

FIG. 6 is a cross-sectional view showing one NAND cell in the memory cell array;

FIG. 11A is a view showing data in each data cache after internal data reading, and FIG. 11B is a view showing data in each data cache after the first setting of each data cache;

FIG. 12A is a view showing data in each data cache after a first step of writing a second page, and FIG. 12B is a view showing data in each data cache after the second setting of each data cache;

FIG. 13A is a view showing data in each data cache after a second step of writing the second page, and FIG. 13B is a view showing data in each data cache when the first step of writing the second page is eliminated;

DETAILED DESCRIPTION OF THE INVENTION

Embodiments according to the present invention will now be described hereinafter with reference to the accompanying drawings.

First Embodiment

Figure 3:
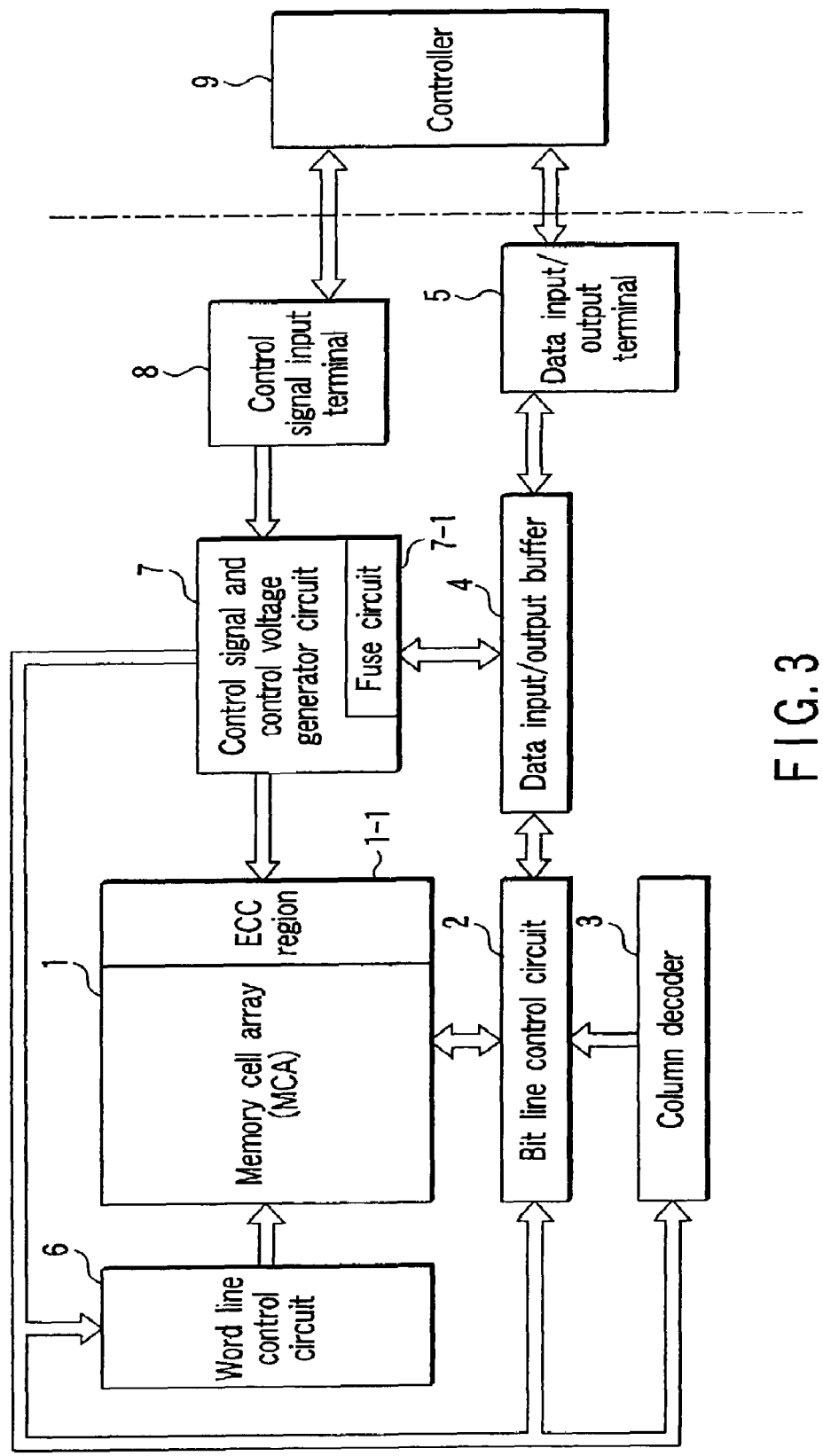
FIG. 3 is a view showing an outline configuration of a semiconductor memory device to which the present invention is applied.

FIG. 3 shows an outline configuration of a semiconductor memory device which stores data having three or more values, e.g., a configuration of a NAND flash memory which stores four values (two bits).

A memory cell array 1 includes a plurality of bit lines, a plurality of word lines, and a common source line. In the memory cell array 1, electrically rewritable memory cells made up of, e.g., EEPROM cells are arranged in a matrix. A bit line control circuit 2 which controls bit lines and a word line control circuit 6 are connected to this memory cell array 1.

The bit line control circuit 2 includes a plurality of data storage circuits and flag data storage circuits, as will be described later. This bit line control circuit 2 reads data in a memory cell of the memory cell array 1 via a bit line, detects a state of a memory cell in the memory cell array 1 via a bit line, and writes data into a memory cell in the memory cell array 1 by applying a write control voltage to the memory cell via a bit line. A column decoder 3 and a data input/output buffer 4 are connected to the bit line control circuit 2. The data storage circuit in the bit line control circuit 2 is selected by the column decoder 3. Data in the memory cell read into the data storage circuit is output via the data input/output buffer 4 from a data input/output terminal 5 to the outside.

Further, write data input from the outside to the data input/output terminal 5 is input via the data input/output buffer 4 to the data storage circuit selected by the column decoder 3.

The word line control circuit 6 is connected to the memory cell array 1. This word line control circuit 6 selects a word line in the memory cell array 1 and applies to the selected word line a voltage necessary for a read, write or erase operation.

The memory cell array 1, the bit line control circuit 2, the column decoder 3, the data input/output buffer 4 and the word line control circuit 6 are connected to and controlled by a control signal and control voltage generator circuit 7. The control signal and control voltage generator circuit 7 is connected to a control signal input terminal 8 and is controlled by a control signal input via the control signal input terminal 8 from the outside.

The bit line control circuit 2, the column decoder 3, the word line control circuit 6, and the control signal and control voltage generator circuit 7 constitute a write circuit and a read circuit.

Furthermore, the memory cell array 1 has an ECC region 1-1 in which an error correction code (ECC) is stored.

Moreover, the data input/output terminal 5 and the control signal input terminal 8 of the NAND flash memory are connected with a controller 9 provided outside a NAND flash memory chip. This controller 9 transmits/receives data or commands between the NAND flash memory and, e.g., a non-illustrated host device.

Additionally, the control signal and control voltage generator circuit 7 has a fuse circuit 7-1. This fuse circuit 7-1 is constituted of, e.g., a non-volatile memory, a laser fuse or a latch circuit, and stores data required to control operations of the write circuit and the read circuit as will be described later. It is to be noted that, in case of a latch circuit, data stored in a specific block in the memory cell array is stored in the latch circuit when turning on a power supply.

Figure 4:
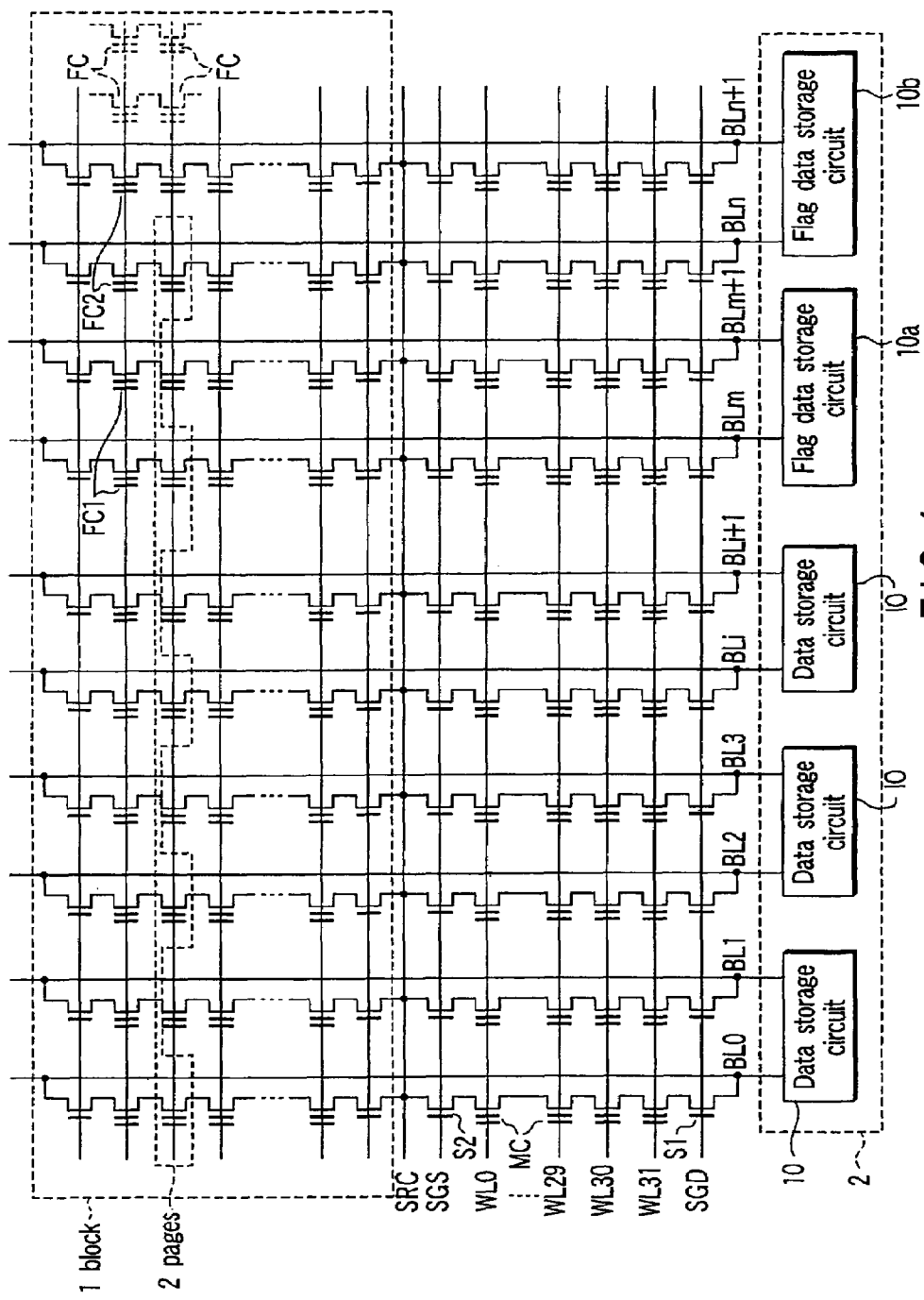
FIG. 4 is a circuit diagram showing a configuration of a memory cell array and a bit line control circuit depicted in FIG. 3.

FIG. 4 shows a configuration of the memory cell array 1 and the bit line control circuit 2 depicted in FIG. 3. In the memory cell array 1, a plurality of NAND cells are arranged. A NAND cell is composed of, e.g., a memory cell MC made up of, e.g., 32 EEPROMs connected in series and select gates S1 and S2. The first select gate S1 is connected to a bit line BL0, and the second select gate S2 is connect to a source line SRC. Control gates of the memory cells MC arranged in each row are connected equally to word lines WL0, WL1 and WL2 to WL31. Further, the first select gate S1 is connected equally to a select line SGD, and the second select gate S2 is connected equally to a select line SGS.

Furthermore, a plurality of memory cells (memory cells enclosed by a broken line) arranged for every other bit line and connected to one word line constitute one sector. Data is written or read in sectors. Data corresponding to, e.g., two pages is stored in one sector. Moreover, first and second flag cells FC1 and FC2 which store flags are connected to each word line. That is, in this embodiment, one sector includes the two first and second flag cells FC1 and FC2.

The bit line control circuit 2 has the plurality of data storage circuits 10 and the flag data storage circuits 10a and 10b. Each data storage circuit 10 and the flag data storage circuits 10a and 10b are connected to a pair of bit lines (BL0 and BL1), (BL2 and BL3) . . . (BLi and BLi+1), (BLm and BLm+1) or (BLn and BLn+1).

As indicated by a broken line, the memory cell array 1 includes a plurality of blocks. Each block is composed of a plurality of NAND cells, and data is erased in blocks. Additionally, an erase operation is carried out simultaneously on the two bit lines connected to the data storage circuit 10 and the flag data storage circuits 10a and 10b.

In a read operation, a program verify operation, and a program operation, one of the two bit lines (BLi and BLi+1) connected to the data storage circuit 10 is selected in accordance with an address signal specified from the outside. Further, one word line is selected in accordance with an external address so that one sector (corresponding to two pages) is selected. Changeover of two pages is performed by using an address.

It is to be noted that the number of the first and second flags FC1 and FC2 connected with one sector is not restricted to one, and a plurality of flag cells FC may be connected to one sector as indicated by a broken line. In this case, as will be described later, it is good enough to determine data stored in the flag cells based on a majority decision of data stored in the plurality of flag cells.

Furthermore, the cell in which ECC data is stored and the data storage circuit connected to such a cell are the same as those in the circuit configuration depicted in FIG. 4, and hence they are eliminated in FIG. 4.

FIGS. 5A and 5B are cross-sectional views showing a memory cell and a select transistor. FIG. 5A shows a memory cell. In a substrate 41, an n-type diffused layer 42 is formed as a source and a drain of a memory cell. A floating gate (FG) 44 is formed above the substrate 41 via a gate insulating film 43, and a control gate (CG) 46 is formed above this floating gate 44 via an insulating film 45. FIG. 5B shows a select gate. In a substrate 41, an n-type diffused layer 47 is formed as a source and a drain. A control gate 49 is formed above the substrate 41 via a gate insulating film 48.

FIG. 6 shows a cross section of one NAND cell in the memory cell array. In this example, one NAND cell is constituted by connecting 32 memory cells MC having the configuration depicted in FIG. 5A in series. The first select gate S1 and the second select gate S2 having the configuration depicted in FIG. 5B are provided on a drain side and a source side of the NAND cell.

Figure 7:
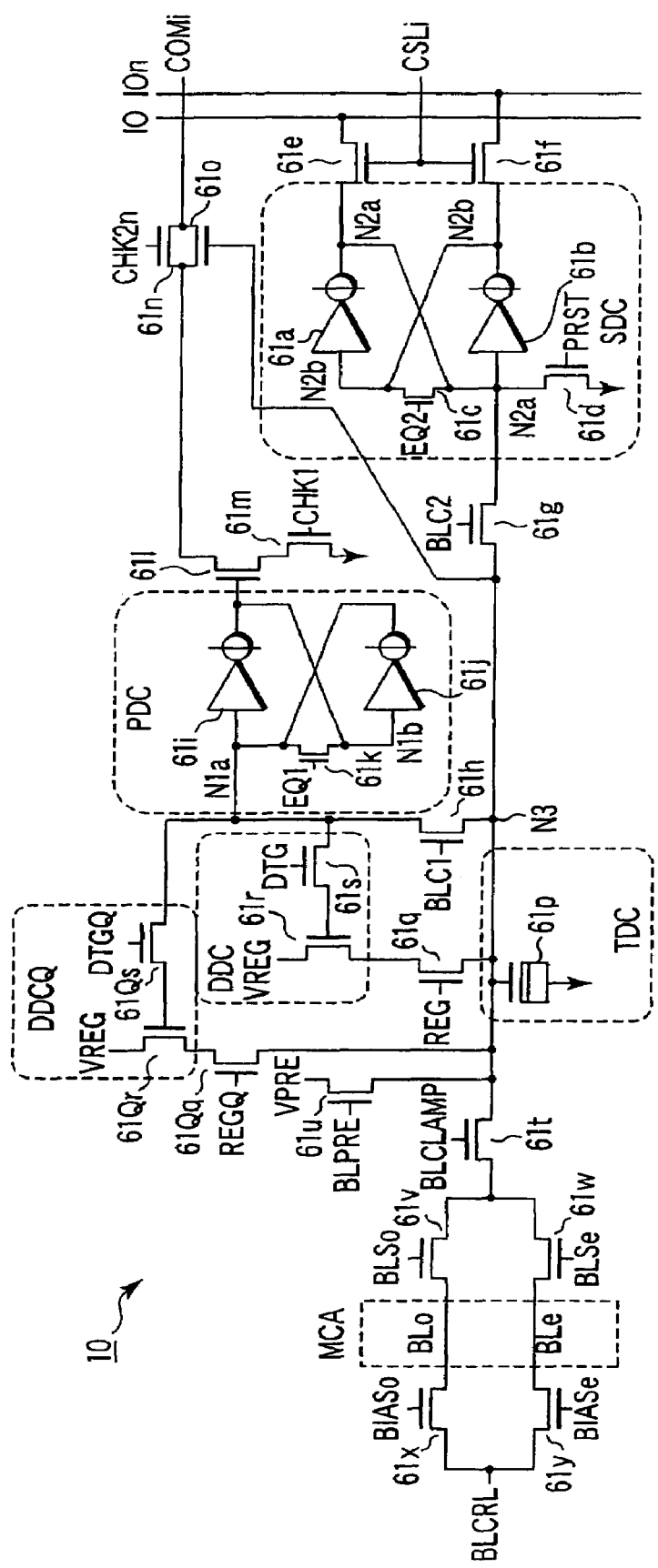
FIG. 7 is a circuit diagram showing an example of a data memory circuit depicted in FIG. 4.

FIG. 7 is a circuit diagram showing an example of the data storage circuit 10 depicted in FIG. 4. The flag data storage circuits 10a and 10b also have the same configuration as the data storage circuit 10.

This data storage circuit 10 has a primary data cache (PDC), a secondary data cache (SDC), a dynamic data cache (DDC), a dynamic data cache Q (DDCQ), and a temporary data cache (TDC). The SCD, PDC and DDC hold input data in a write operation, hold read-out data in a read operation, temporarily hold data in a verify operation, and are used for a manipulation of internal data in storing multivalued data. The TDC amplifies data on a bit line and temporarily holds data in a data read operation, and is used for a manipulation of internal data in storing multivalued data. The DDCQ stores data indicating whether a verify level slightly lower than a specific verify level has been reached in a later-described write operation.

The SDC is composed of clocked inverter circuits 61a and 61b constituting a latch circuit and transistors 61c and 61d. The transistor 61c is connected between an input end of the clocked inverter circuit 61a and an input end of the clocked inverter circuit 61b. A signal EQ2 is supplied to a gate of this transistor 61c. The transistor 61d is connected between the input end of the clocked inverter circuit 61b and the ground. A signal PRS is supplied to a gate of this transistor 61d. A node N2a of the SDC is connected with an input/output data line IO via a column select transistor 61e, and a node N2b is connected with an input/output data line IOn via a column select transistor 61f. A column select signal CSLi is supplied to gates of these transistors 61e and 61f. The node N2a of the SDC is connected to a node N1a of the PDC via transistors 61g and 61h. A signal BLC2 is supplied to a gate of the transistor 61g, and a signal BLC1 is supplied to a gate of the transistor 61h.

The PDC is composed of clocked inverter circuits 61i and 61j and a transistor 61k. The transistor 61k is connected between an input end of the clocked inverter circuit 61i and an input end of the clocked inverter circuit 61j. A signal EQ1 is supplied to a gate of this transistor 61k. A node N1b of the PDC is connected with a gate of a transistor 61l. One end of a current path of this transistor 61l is connected to the ground via a transistor 61m. A signal CHK1 is supplied to a gate of this transistor 61m. Furthermore, the other end of the current path of the transistor 61l is connected with one end of a current path of transistors 61n and 61o constituting a transfer gate. A signal CHK2n is supplied to a gate of this transistor 61n. Moreover, a gate of the transistor 61o is connected with a junction node between the transistors 61g and 61h. A signal COMi is supplied to the other end of the current path of the transistors 61n and 61o. This signal COMi, which is common to all of the data storage circuits 10, is a signal to indicate whether all of the data storage circuits 10 have been verified. That is, as will be described later, if they have been verified, the node N1b of the PDC goes low. In this state, when the signals CHK1 and CHK2n are made high, if the verification has been completed, the signal COMi goes high.

Furthermore, the TDC is composed of, e.g., an MOS capacitor 61p. This capacitor 61p is connected between the junction node N3 of the transistors 61g and 61h and the ground. Additionally, the DDC is connected to the junction node N3 via a transistor 61q. A signal REG is supplied to a gate of the transistor 61q.

The DDC is composed of transistors 61r and 61s. A signal VREG is supplied to one end of a current path of the transistor 61r, and the other end of this current path is connected with a current path of the transistor 61q. A gate of this transistor 61r is connected to the node N1a of the PDC via the transistor 61s. A signal DTG is supplied to a gate of this transistor 61s.

The DDCQ is composed of transistors 61Qr and 61Qs. The signal VREG is supplied to one end of a current path of the transistor 61Qr, and the other end of this current path is connected with the junction node N3 via the transistor 61Qq. A signal REGQ is supplied to a gate of the transistor 61Qq. A gate of the transistor 61Qr is connected to the node N1a of the PDC via the transistor 61Qs. A signal DTGQ is supplied to a gate of this transistor 61Qs.

Further, one end of a current path of transistors 61t and 61u is connected to the junction node N3. A signal VPRE is supplied to the other end of the current path of the transistor 61u, and BLPRE is supplied to a gate of the transistor 61u. A signal BLCLAMP is supplied to a gate of the transistor 61t.

The other end of the current path of this transistor 61t is connected to one end of a bit line BLo via a transistor 61v, and to one end of a bit line BLe via a transistor 61w. The other end of the bit line BLo is connected to one end of a current path of a transistor 61x. A signal BIASo is supplied to a gate of this transistor 61x. The other end of the bit line BLe is connected with one end of a current path of a transistor 61y. A signal BIASe is supplied to a gate of this transistor 61y. A signal BLCRL is supplied to the other end of the current path of these transistors 61x and 61y. The transistors 61x and 61y are turned on in accordance with signals BIASo and BIASe to be complementary to the transistors 61v and 61w, thereby applying a potential of the signal BLCRL to an unselected bit line.

Each signal and voltage mentioned above are generated by the control signal and control voltage generator circuit 7 shown in FIG. 3. Under the control of this control signal and control voltage generator circuit 7, the following operations are controlled.

Since this memory is a multivalued memory, it can store two-bit data in a single cell. Switching of the two bits is performed by using an address (a first page or a second page).

(Description of Operations)

Operations in the above-mentioned configuration will now be described.

Figure 1A:
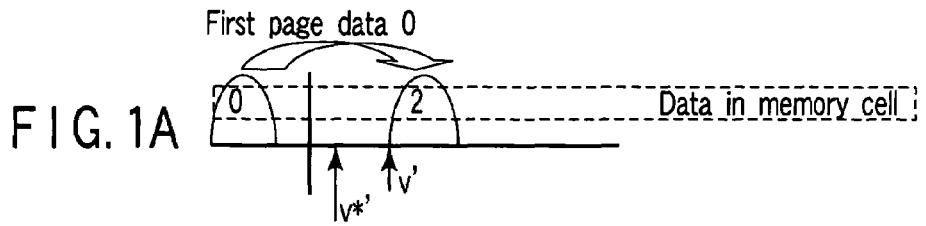
FIGS. 1A to 1E are views showing a relationship between data in a memory cell and a threshold voltage of the memory cell according to the present invention.

FIGS. 1A to 1E show a relationship between data in a memory cell and a threshold voltage of the memory cell. When erasing is done, data in the memory cell becomes "0". As shown in FIG. 1A, when a first page is written, data in the memory cell becomes data "0" and data "2". A threshold voltage distribution of the data "2" is set to be slightly lower than a threshold voltage distribution of original data "2".

Figure 1B:
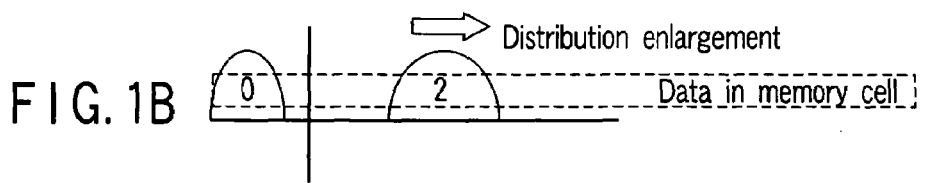
Figure 1C:
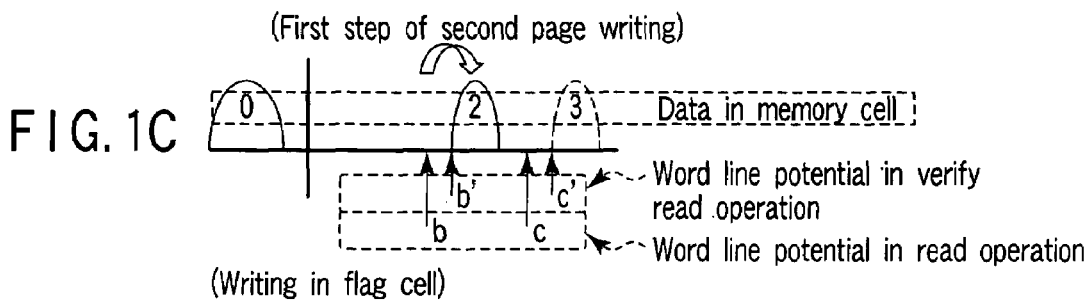
Figure 1D:
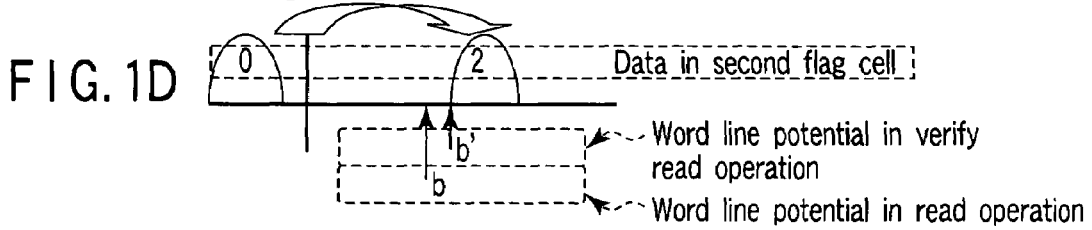
Figure 1E:
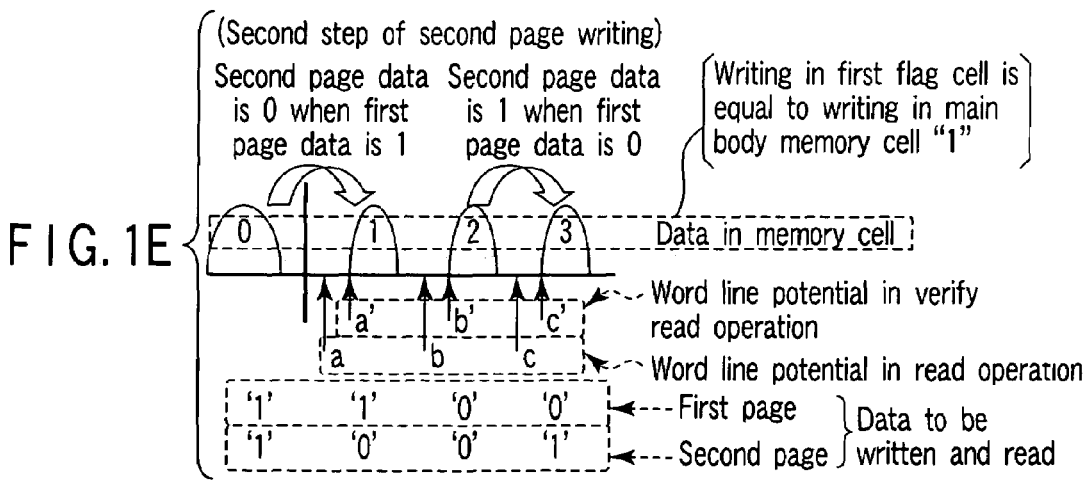

Thereafter, as shown in FIG. 1B, data is written in an adjacent cell before writing a second page. Then, a threshold voltage distribution of the data "2" is increased due to the data written in this cell. Subsequently, when data of the second page is written, data in a memory cell becomes data "0" to "3" having an original threshold voltage as shown in FIG. 1E. In this embodiment, data in a memory cell is defined in an ascending order from a lower threshold voltage.

Difference between an operation of this embodiment shown in FIGS. 1A to 1E and a write operation of the related art depicted in FIGS. 2A to 2D is as described below.

In this embodiment, after writing data in an adjoining cell, the second page is written in two stages. As shown in FIG. 1C, since it is good enough to perform a write operation with a threshold voltage of a level "b" or above at a first step, data "2" of the first page is written with the original threshold voltage "b". Alternatively, the data "2" of the first page is written with threshold voltages of "b" and "c" (indicated by a broken line in FIG. 1C). In addition to this, as shown in FIG. 1D, the data "2" is likewise written in a second flag cell FC2. It can be determined that the data of the second page has been written based on the data in this second flag cell FC2. Thereafter, in a second step of writing the second page, when data of the first page is "1" and data of the second page is "0", data "1" is written. Further, when data of the first page is "0" and data of the second page is "1", data "3" is written. In this manner, a threshold distribution shown in FIG. 1E can be set.

Even if a power supply is turned off during a write operation of the second page, a threshold voltage of the first page data does not overlap threshold voltages of other data as shown in FIGS. 1B and 1C. Therefore, the data of the first page is not destroyed even if the write operation of the second page fails. Accordingly, setting a potential of a word line to a potential "a" or "b" shown in FIG. 1E in a read operation can read the data of the first page.

Conversely, in the case of the related art depicted in FIGS. 2A to 2D, after writing data in an adjoining cell depicted in FIG. 2B, a write operation is simultaneously carried out to achieve a level "a" and a level "b" as shown in FIG. 2C to set a threshold voltage depicted in FIG. 2D. As shown in FIG. 2C, data "2" does not reach an original threshold voltage during the write operation of the second page. Moreover, in case of writing data "1", there is a possibility that a threshold voltage distribution of the data "1" overlaps a threshold voltage distribution of the data "2". In this state, when a power supply is turned off, the first page data is destroyed. Therefore, it is difficult to read the first page data.

Figure 8:
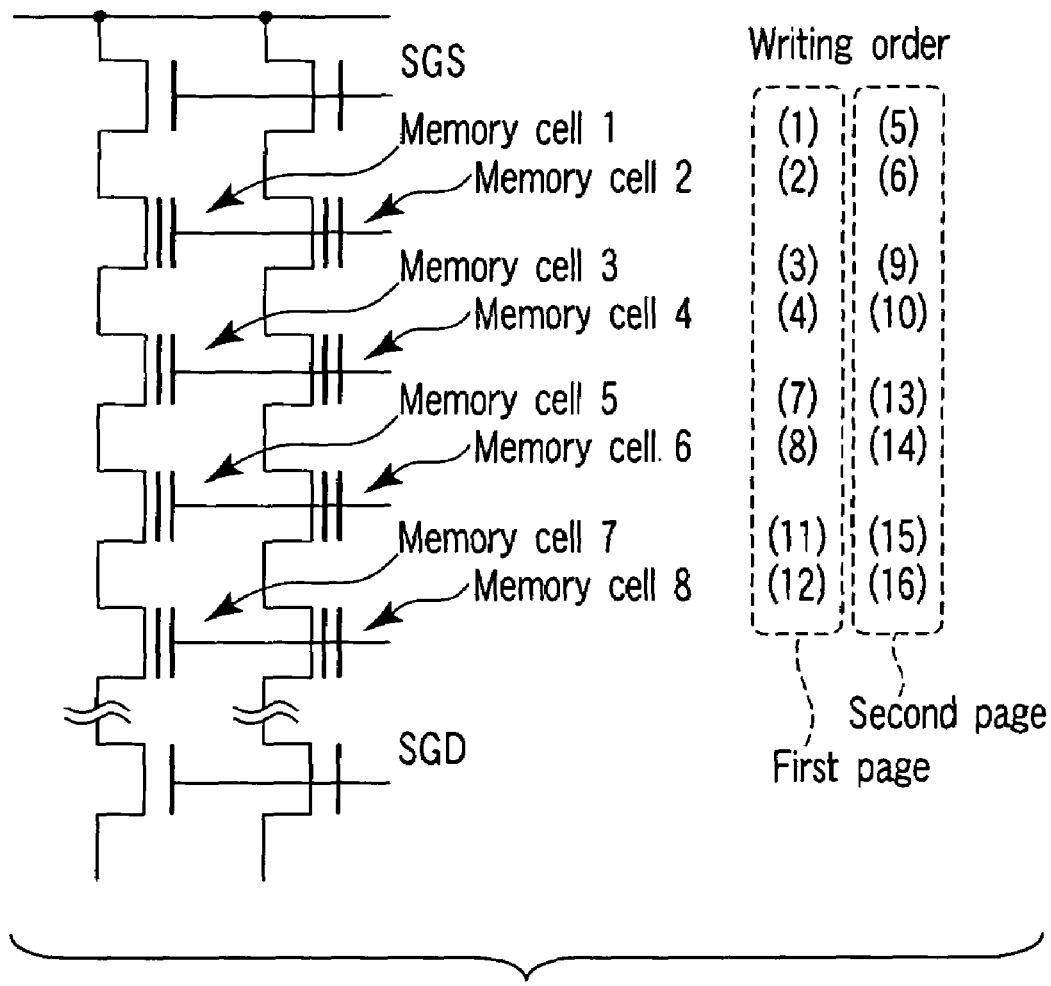
FIG. 8 is a view showing a writing order with respect to the NAND cell.

FIG. 8 shows a writing order with respect to a NAND cell. In a block, a write operation is carried out from a memory cell close to a source line in accordance with each page. In FIG. 8, the number of word lines is four for convenience sake.

In a first write operation, one-bit data is written in a first page of a memory cell 1.

In a second write operation, one-bit data is written in a first page of a memory cell 2 adjacent to the memory cell 1 in the word direction.

In a third write operation, one-bit data is written in a first page of a memory cell 3 adjacent to the memory cell 1 in the bit direction.

In a fourth write operation, one-bit data is written in a first page of a memory cell 4 diagonally adjacent to the memory cell 1.

In a fifth write operation, one-bit data is written in a second page of the memory cell 1.

In a sixth write operation, one-bit data is written in a second page of the memory cell 2 adjacent to the memory cell 1 in the word direction.

In a seventh write operation, one-bit data is written in a first page of a memory cell 5 adjacent to the memory cell 3 in the bit direction.

In an eighth write operation, one-bit data is written in a first page of a memory cell 6 diagonally adjacent to the memory cell 3.

In a ninth write operation, one-bit data is written in a second page of the memory cell 3.

In a 10th write operation, one-bit data is written in a second page of a fourth memory cell 4 adjacent to the memory cell 3 in the word direction.

In an 11th write operation, one-bit data is written in a first page of a memory cell 7 adjacent to the memory cell 5 in the bit direction.

In a 12th write operation, one-bit data is written in a first page of a memory cell 8 diagonally adjacent to the memory cell 5.

In a 13th write operation, one-bit data is written in a second page of the memory cell 5.

In a 14th write operation, one-bit data is written in a second page of the memory cell 6 adjacent to the memory cell 5 in the word direction.

In a 15th write operation, one-bit data is written in a second page of the memory cell 7.

In a 16th write operation, one-bit data is written in a second page of the memory cell 8 adjacent to the memory cell 7 in the word direction.

Specific write operations will now be described hereinafter.

(Program Operation and Program Verify Operation)

(First Page Program Operation)

Figure 9:
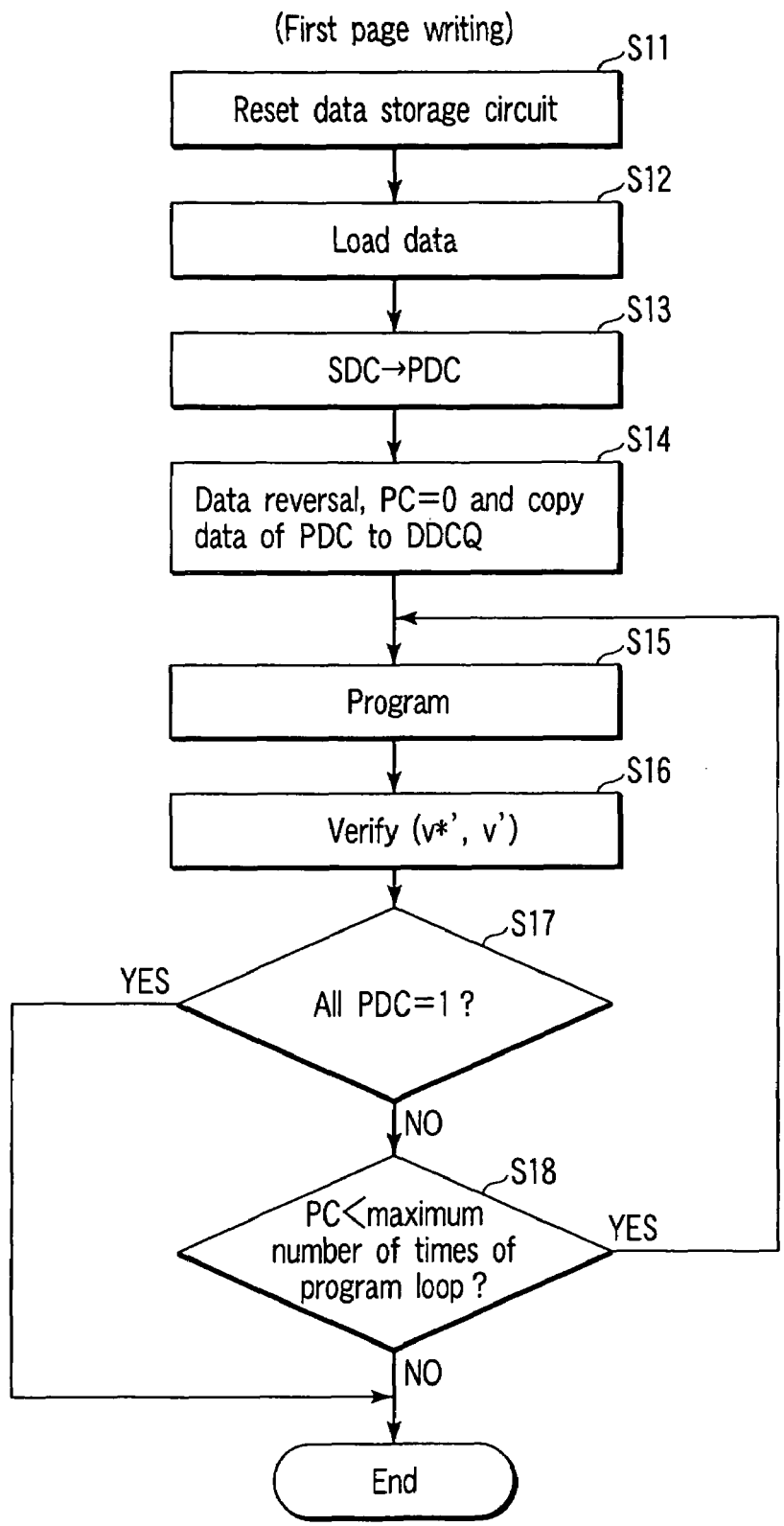
FIG. 9 is a flowchart showing an example of a first page program.

FIG. 9 is a flowchart showing an example of a program operation for a first page. In the program operation, an address is first specified to select two pages (one sector) shown in FIG.

4. This memory can perform the program operation only in the order of a first page and a second page of these two pages. Therefore, the first page is first selected based on the address.

When the transistor 61d shown in FIG. 7 is turned on during input of this address, the nodes N2a of all the SDCs are set to ground potential Vss (S11).

Then, write data is externally input and stored in the SDCs in all data storage circuits 10 (S12). At this time, in case of writing data, data "0" is externally input, but the nodes N2a of the SDCs are set to a power supply voltage Vdd. Further, when a write operation is not selected, data "1" is externally input, but the nodes N2a of the SDCs are set to ground potential Vss. Thereafter, when a write command is input, data in the SDCs of all the data storage circuits 10 is transferred to the PDCs (S13). That is, it is assumed that the signals BLC1 and BLC2 are set to a predetermined voltage, e.g., Vdd+Vth (Vdd: a power supply voltage (e.g., 3V or 1.8V, but it is not restricted to this voltage), and Vth: a threshold voltage of an N-channel MOS transistor), and the transistors 61h and 61g are turned on. Then, data in the nodes N2a is transferred to the PDCs through the transistors 61g and 61h. Therefore, when the data "1" (the write operation is not performed) is input from the outside, the node N1a of the PDC is set to a low level. When the data "0" (the write operation is carried out) is input, the node N1a of the PDC is set to a high level. Thereafter, data in the PDC is set to a potential of the node N1a, and data in the SDC is set to a potential of the node N2a.

(Data Reversing Operation) (S14)

Then, the signal VPRE is set to Vdd whilst the signal BLPRE is set to Vdd+Vth, and the junction node N3 is temporarily pre-charged to Vdd. Subsequently, the signal DTG is set to Vdd+Vth, and data in the PDC is transferred to the DDC. Then, the signal REG is set to Vdd, and the signal VREG is set to Vss. If data in the DDC is on the high level, the junction node N3 changes to the low level. When data in the DDC is on the low level, the junction node N3 remains on the high level. Thereafter, output signals of 61i and 61j are temporarily turned off, the signal EQ1 is set to Vdd, and the nodes N1a and N1b are set to the same potential. Then, the signal BLC1 is set to Vdd+Vth, and data in the TDC (a potential of the junction node N3) is transferred to the PDC. As a result, if data "1" is latched in the PDC from the beginning, this data becomes data "0". If the data "0" is latched, this data becomes data "1".

When a write command is input, the control signal and control voltage generator circuit 7 supplies a program voltage Vpgm (e.g., 20V) to a selected word line, and Vpass (e.g., 10V) to a non-selected word line. However, since these voltages are not immediately increased, the data reversing operation is carried out in a waiting time. Therefore, a write speed is not decreased.

In reversing input data in this manner, when performing so-called page copy in which data of the first page written in a memory cell is read out to a page buffer and this data is written in the other page without outputting to the outside, a read operation is first carried out, but the SDC takes "1" with respect to written data (data "0") and the SDC takes "0" with respect to non-written data (data "1"). This data in the SDC matches with data input as reversed data, namely, the SDC="1" is achieved when the write operation is effected, and the SDC="0" is attained when the write operation is not performed. Matching the next write data with the SDC in this manner can facilitate inputting data from outside and rewriting a part of read-out data. Therefore, even if page copy is not performed, data input from the outside is always reversed in the page buffer.

After the data reversing operation, data in the PDC is also copied to the DDC.

Meanwhile, in the program operation for the first page, data is not written in a flag cell. Therefore, the PDC in the flag data storage circuit 10a has data "1".

(Program Operation) (S15)

A potential of the signal BLC1, BLCLAMP, BLSo or BLSe shown in FIG. 7 is set to Vdd+Vth. Then, the transistor 61h, 61t, 61v or 61w is turned on, and data held in the PDC is supplied to a bit line. If data "1" (the write operation is not performed) is stored in the PDC, a bit line is set to Vdd (the power supply voltage). If data "0" (the write operation is performed) is stored in the same, a bit line is set to Vss (ground potential). Furthermore, data must not be written in a cell which is connected with a selected word line and has a non-selected page (a bit line is not selected). Therefore, Vdd is also supplied to a bit line connected to such a cell like the example of data "1". Here, Vdd is applied to a select line SGD, a potential Vpgm (20V) is applied to a selected word line and a potential Vpass (10V) is applied to a non-selected word line in a selected block. Then, when a bit line is set to Vss, a channel of a cell is set to Vss and a word line is set to Vpgm. Therefore, a write operation is performed. On the other hand, when a bit line is set to Vdd, a channel of a cell is not set to Vss but booted by coupling. Therefore, a potential difference between a gate and the channel is reduced to approximately Vpgm/2, and a write operation is not effected.

Since the multivalued memory narrows a threshold voltage distribution, an original verify level "v'" and a lower verify level "v*'" are set. There is adopted a method by which an intermediate potential (between Vdd and Vss, e.g., 1V) is supplied to a bit line of a cell having a verify level which is greater than the verify level "v*'" and equal to or smaller than the verify level "v'", thereby lowering a write speed. At this point in time, when the signal VREG is set to Vdd and the signal REG is set to an intermediate potential+Vth (e.g., 1V+Vth), a bit line is set to the intermediate potential in a case where the bit line is set to Vss and the DDC is on the high level. The bit line remains at Vss in a case where the DDC is on the low level. The bit line remains at Vdd in a case where the bit line is set to Vdd.

When write data is "0", data in a memory cell is changed to "2" as shown in FIG. 1A. When write data is "1", data in a memory cell remains as "0".

(First Page Verify Operation) (S16)

In writing a first page, a write operation is performed until the verify level "v'" is reached as shown in FIG. 1A. Therefore, at a first step of a verify operation, as shown in FIG. 1A, the verify operation is performed by using the potential "v*'" lower than an original potential "v'" of a word line in the verify operation. Then, at a second step, the potential of the word line is set to "v'". "*" means a potential lower than an original value hereinafter.

First, a potential Vread for a read operation is given to a non-selected word line and a select line SGD in a selected block. Further, in the data storage circuit 10 shown in FIG. 7, for example, Vdd+Vth is supplied to the signal BLPRE, a predetermined voltage, e.g., 1V+Vth is supplied to the signal BLCLAMP to set the signal VPRE to Vdd, and a bit line is pre-charged to 1V.

Then, the select line SGS on the source side of a cell is set to the high level. A cell whose threshold voltage is higher than the potential "v*'" is turned off. Therefore, its bit line remains at the high level. Moreover, a cell whose threshold voltage is lower than the potential "v*'" is turned on. Therefore, its bit line is set to Vss.

Subsequently, a predetermined voltage, e.g., Vdd+Vth is supplied to the signal BLPRE to set the signal VPRE to Vdd. As a result, the junction node N3 of the TDC is pre-charged to Vdd. Then, the signal BLCLAMP is set to a predetermined voltage, e.g., 0.9V+Vth to turn on the transistor 61*t*. The node N3 of the TDC is set to the low level when its bit line is on the low level, and it is set to the high level when its bit line is on the high level.

Here, in a case where a write operation is performed, data indicative of the low level is stored in the DDC shown in FIG. 7. In a case where the write operation is not performed, data indicative of the high level is stored in the DDC. Therefore, when the signal VREG is set to Vdd and the signal REG is changed to the high level, the node N3 of the TDC is forcibly changed to the high level only in a case where the write operation is not performed. After this operation, data in the PDC is transferred to the DDC, and a potential of the TDC is transferred to the PDC. A high-level signal is latched in the PDC only when data is not written in a cell and when data "2" has been written in a cell and a threshold voltage of this cell has reached the verify potential "v*'". Additionally, a low-level signal is latched in the PDC only when a threshold voltage of a cell does not reach "v*'".

Then, when a voltage of a word line is increased from "v*'" to "v'", a cell whose threshold voltage is lower than "v'" is turned on, and its bit line is set to Vss.

Subsequently, a predetermined voltage, e.g., Vdd+Vth is supplied to the signal BLPRE to set the signal VPRE to Vdd, whereby the junction node N3 of the TDC is pre-charged to Vdd. Thereafter, the signal BLCLAMP is set to a predetermined voltage, e.g., 0.9V+Vth to turn on the transistor 61*t*. The node N3 of the TDC is set to the low level when its bit line is on the low level, and it is set to the high level when its bit line is on the high level.

Here, in a case where a write operation is performed, data indicative of the low level is stored in the DDC shown in FIG. 7. In a case where a write operation is not carried out, data indicative of the high level is stored in the DDC. Therefore, when the signal VREG is set to Vdd and the signal REG is changed to the high level, the node N3 of the TDC is forcibly set to the high level only when the write operation is not performed. After this operation, data in the PDC is transferred to the DDC, and a potential of the TDC is transferred to the PDC. The high-level signal is latched in the PDC only when data is not written in a cell and when data "2" has been written in a cell and a threshold voltage of this cell has reached the verify potential "v'". Further, the low level signal is latched in the PDC only when a threshold voltage of a cell does not reach "v'".

As a result, the DDC is set to the high level when a threshold voltage of a cell exceeds "v*'" and when a write operation is not selected. The DDC is set to the low level when a write operation is performed and when a threshold voltage of a cell is not greater than "v*'". The PDC is set to the high level when a threshold voltage of a cell exceeds "v'" and when a write operation is not selected. The PDC is set to the low level when a write operation is carried out and when a threshold voltage of a cell is not greater than "v'".

If the PDC is on the low level, the write operation is again performed, and this program operation and the verify operation are repeated until data in all the data storage circuits 10 change to the high level (S18 to S15). However, in the case of the write operation with respect to a cell in which the PDC is on the low level and the DDC is on the high level, i.e., a cell whose threshold voltage is not smaller than "v*'" and not greater than "v'", an intermediate potential is applied to its bit line to suppress a write speed.

The program operation is executed in such a manner that a value of a program execution number counter PC cleared at step S14 does not exceed a maximum number of times of the program.

(Adjacent Cell Program)

As shown in FIG. 8, after writing one-bit data in a first page of a memory cell 1, writing data in a first page of a memory cell 2 adjacent to the memory cell 1 in the word direction, writing data in a first page of a memory cell 3 adjacent to the memory cell 1 in the bit line direction and writing data in a first page of a memory cell 4 diagonally adjacent to the memory cell 1 are sequentially performed. When these write operations are carried out, a threshold voltage of the memory cell 1 is increased due to an inter-floating-gate capacity depending on write data. Therefore, as shown in FIG. 1B, a threshold voltage distribution of each of data "0" and data "2" in the memory cell 1 expands toward a higher potential.

Then, in a fifth write operation shown in FIG. 3, one-bit data is written in a second page of the memory cell 1.

(Second Page Program)

FIGS. 1C and 1D show a writing order of a second page program. In the case of the related art shown in FIG. 2, data is written in the second page to simultaneously achieve threshold voltage levels "a'", "b'" and "c'". However, in this embodiment, at a first step of the second page program, data is written to achieve the threshold voltage level "b'" in a cell in which data has been written in the first page thereof at the threshold voltage level "v'". Subsequently, at a second step, a write operation is performed by using the input data of the second page to simultaneously achieve the threshold voltage levels "a'" and "c'". Alternatively, at the first step of the second page program, data is written to achieve the threshold voltage levels "b'" and "c'" in a cell in which data has been written in the first page thereof at the threshold voltage level "v'". Then, at the second step, a write operation is carried out to attain the threshold level "a'". That is, data "2" and "3" may be written at the first step, and data "1" may be written at the second step.

Figure 10:
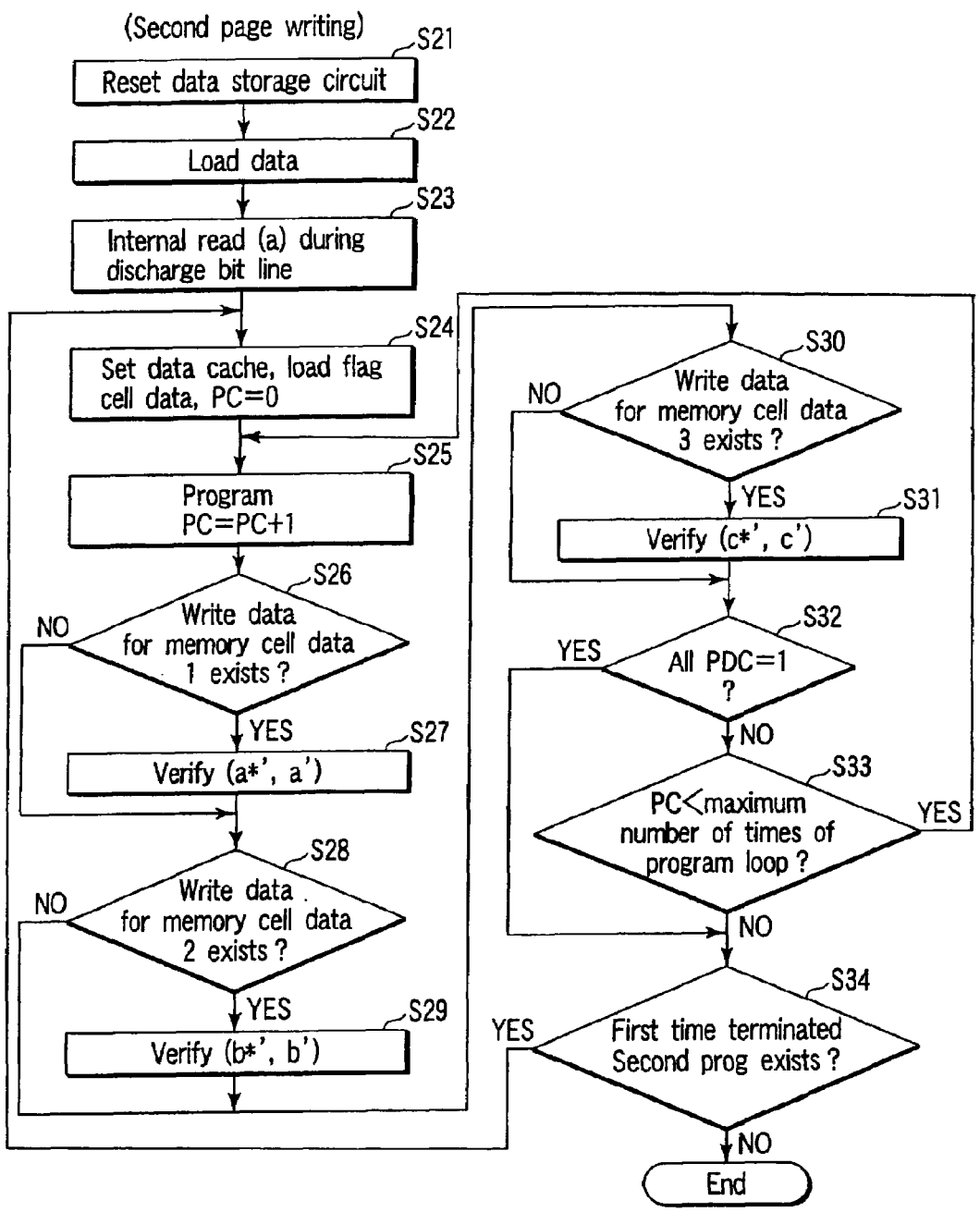
FIG. 10 is a flowchart showing an example of second page program.

FIG. 10 is a flowchart showing an example of the second page program. In the second page program, two pages shown in FIG. 4 are likewise first selected in accordance with an address. At the same time, the page buffer is reset (S21).

Then, write data is externally input and stored in the SDCs in all the data storage circuits (S22). When data "1" (a write operation is not executed) is externally input, the node N2*a* of the SDC in each data storage circuit 10 enters the low level. When data "0" (a write operation is executed) is externally input, the node N2*a* enters the high level.

(Internal Data Read Operation) (S23)

First, before writing data in a cell, it is required to judge whether data of a first page of a memory cell is "0" or "2". Therefore, an internal read operation of reading data in a memory cell is carried out. The internal data read operation is completely the same as the read operation. In a judgment upon whether data in a regular memory cell is "0" or "2", a potential "b" at the time of the read operation is supplied to a selected word line. However, in the program operation for the first page, data "2" has been written up to "v'" lower than a regular threshold voltage. Therefore, a threshold voltage of a memory cell may be lower than the potential "b" in some cases. Accordingly, in the internal data read operation, a potential "a" is supplied to a word line to execute the read operation.

FIG. 11A shows data in a data cache after the internal data read operation. That is, in writing data of the first page, data in the PDC is on the low level ("0") when data is not written, and it is on the high level ("1") when data is written.

(First Setting of Data Cache) (S24)

Then, data stored in each data cache becomes as shown in FIG. 11B by manipulating each data cache. That is, transferring or copying data in the SDC, the DDC, the DDCQ or the PDC shown in FIG. 7 can set data in each data cache as shown in FIG. 11B. Since the manipulation of each data cache is not essential in this embodiment, thereby omitting its explanation.

During this setting 1 of each data cache or during the internal read operation, data in a flag cell is also loaded. Furthermore, the program execution number counter PC is cleared.

Data "1" of a memory cell is written in a first flag cell FC1, and data "2" of a memory cell is written in a second flag cell FC2. Therefore, each data cache connected with each memory cell and each flag cell is also set in accordance with written data in the memory cell.

At a first step of a second page write operation, data is written to achieve a level "b" or above with respect to a cell in which first page data has been written at a verify level "v'", and a write operation to attain a level "a" based on second page write data is not executed. As a result, write data of the first page and write data of the second page are controlled in such a manner that their threshold voltage distributions do not overlap.

(First Step) (S25)

Then, data is written in a memory cell. First, the signal BLC1 is set to Vsg (Vdd+Vth, e.g., 2.5V+Vth). Then, a bit line is set to Vss when the PDC has data "0", and the bit line is set to Vdd when the PDC has data "1". Subsequently, after the signal BLC1 is set to Vss, the signal VREG is set to Vdd and the signal REG is set to an intermediate potential+Vth (1V+Vth). As a result, when a bit line is set to Vss, it is provided with an intermediate potential (1V).

Here, assuming that a selected word line has a potential of Vpgm and a non-selected word line has a potential of Vpass, when a bit line has Vdd, a write operation is not executed. Moreover, when a bit line has Vss, a write operation is performed. When a bit line has an intermediate potential (1V), a small amount of data is written.

(First Step Verify Operation)

Then, a verify operation is executed. However, a verify operation at a level "a" (S26 and S27) is eliminated at this time. Therefore, in this example, a potential of a word line is first set to "b*'", and a write verify operation is executed (S28 and S29). This verify procedure is the same as that of the first page. The program operation and the verify operation are repeated until all the PDCs are changed to the high level (S25, S28, S29, S32 and S33). When the write operation is completed, data in each data cache becomes as shown in FIG. 12A. Moreover, when the write operation is completed, the control advances to a step S34 from the step S32. At the step S34, if it is assumed that there is the second program, the control advances to a step S24.

(Second Setting of Data Cache)

Then, data to be stored in each data cache is set as shown in FIG. 12B by manipulating each data cache.

Data "1" in a memory cell is written in a first flag cell FC1, and data "2" in a memory cell is written in a second flag cell FC2. Therefore, each data cache connected with the first and second flag cells FC2 is also set in accordance with written data in a memory cell as shown in FIG. 12B. However, since writing data "2" in the memory cell and the second flag cell 2 has been completed, the PDC=1 is achieved.

(Second Step) (S25)

Then, data is written in a memory cell. First, the signal BLC1 is set to Vsg. As a result, a bit line has a potential Vss when the PDC has data "0", and a bit line has a potential of Vdd when the PDC has data "1". Then, after the signal BLC1 is set to Vss, the signal VREG is set to Vdd, and the signal REG is set to an intermediate potential+Vth (1V+Vth). As a result, when a bit line has a potential Vss, it is provided with an intermediate potential (1V).

Here, assuming that a selected word line has a potential Vpgm and a non-selected word line has a potential Vpass, a write operation is not executed when a bit line has a potential Vdd. Further, a write operation is executed when a bit line has a potential Vss, and a small amount of data is written when a bit line has an intermediate potential (1V).

FIG. 13A shows data in each data cache after the second step of the second page write operation.

(Verify Operation at Second Step Verify Level "a") (S26 and S27)

After the program operation, verify voltages "a*'" and "a'" are sequentially set to a word line to execute a write verify operation. A verify procedure is the same as that of the first page, but a cell in which data "2" or "3" has been written is also passed in this verify operation. Therefore, in place of setting the signal VPRE and the signal VREG to the high level and charging the TDC to Vdd, the SDC is set to the high level and the TDC is charged to Vdd only in a memory cell in which data "1" has been written. According to this operation, a memory cell in which data "2" or "3" has been written is not skipped in this verify operation.

(Verify Operation at Second Step Verify Level "b") (S28 and S29)

Then, verify voltages "b*'" and "b'" are sequentially set with respect to a word line and a write verify operation is executed. Although a verify procedure is the same as that of the first page, a memory cell in which data "3" has been written also passes this verify operation. Therefore, in place of setting the signal VPRE and the signal VREG to the high level and charging the TDC to Vdd, the signal REG is set to the high level and the TDC of a memory cell having data "2" written therein is charged to Vdd. According to this operation, the memory cell having the data "3" written therein is not passed in this verify operation. The data "2" has been written at the first step. Therefore, the verify operation at this second step verify level "b" is not executed since the write data "2" does not exist.

(Verify Operation at Second Step Verify Level "c") (S30 and S31)

Then, verify voltages "c*'" and "c'" are sequentially set with respect to a word line, and a write verify operation is executed. A verify procedure is the same as that of the first page.

The program operation and the verify operation are repeated in this manner until data in all the PDCs change to "1". During the verify operation, writing data "1" is terminated on an earlier stage. Therefore, when there is no cell in which data "1" is to be written, a program verify (a*' and a') operation is not executed. Further, when there is no cell in which data "2" is to be written, a program verify (b*' and b') operation is not performed.

Figure 14:
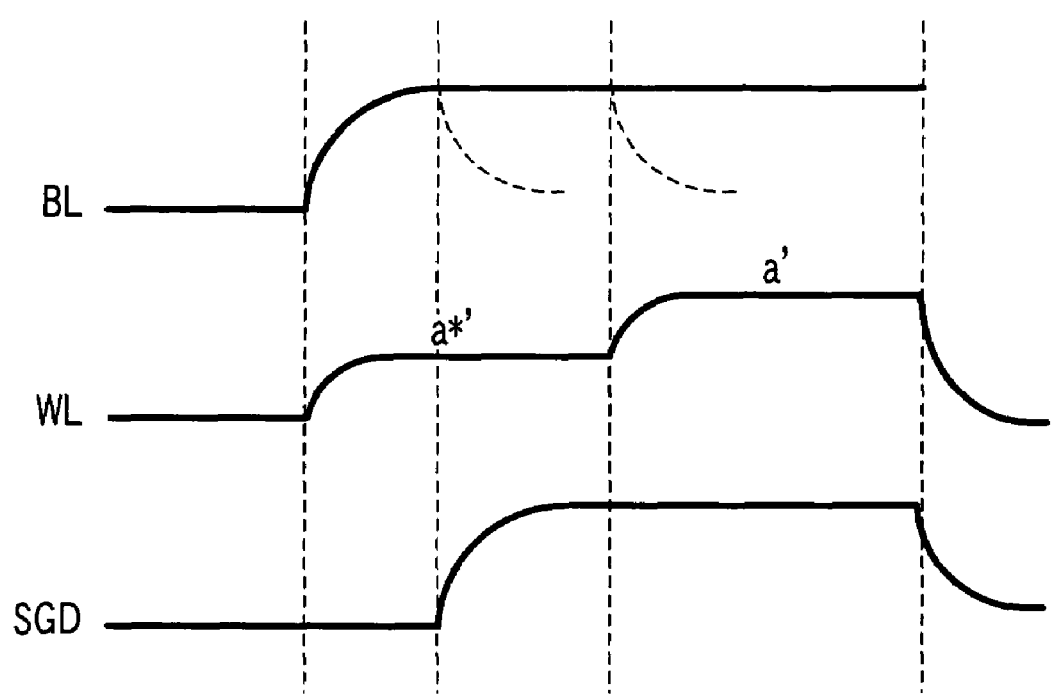
FIG. 14 is a waveform chart showing an example of operations of a word line, a bit line and a select gate line in a verify operation.

FIG. 14 shows an example of operations of a word line WL, a bit line BL and a select gate line SGD in the verify operation. The bit line BL is charged, and a potential of the word line WL is set to "a*'". Then, the select gate line SGD is set to the high level to turn on a select gate S1, and the bit line BL is discharged. As a result, a verify operation is executed with the potential "a*'" of the word line WL. Then, the potential of the word line WL is set to "a'" to discharge the bit line, and the verify operation is performed with the potential "a'" of the word line WL.

(First Page Read Operation)

Figure 15:
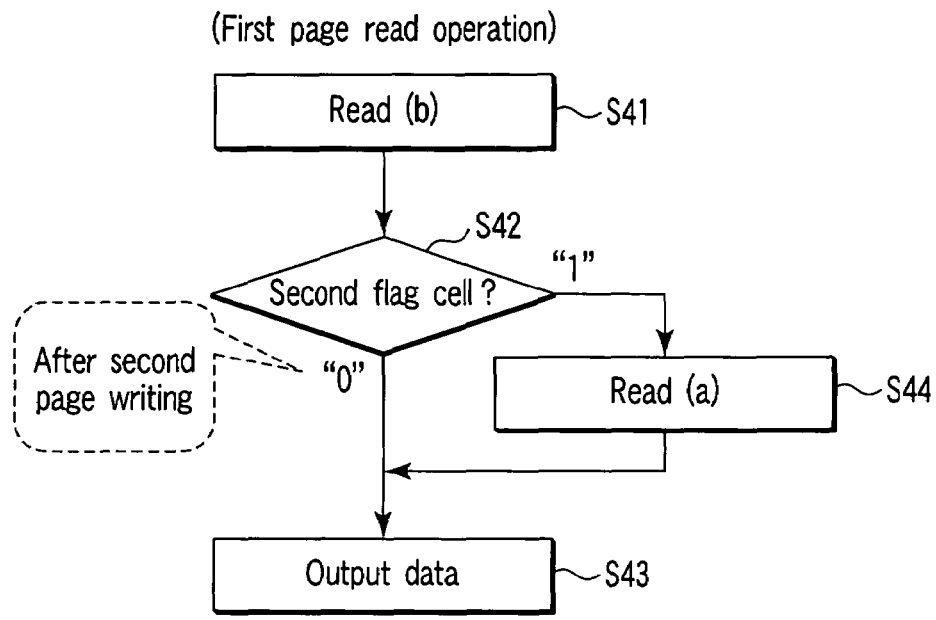
FIG. 15 is a flowchart showing a first page read operation.

FIG. 15 shows a flowchart of a first page read operation. First, an address is specified, and two pages shown in FIG. 4 are selected. As shown in FIGS. 1B and 1C, a threshold voltage distribution varies before and after writing a second page. Therefore, a potential of a word line is first set to "b" to perform a read operation, and whether data in a second flag cell FC2 is "0" or "1" is judged (S41 and S42). When it has been found that the plurality of second flag cells FC2 exist by this judgment, "0" or "1" is judged based on a majority decision of these cells.

If data read from the second flag cell FC2 is "0" (data in a memory cell is "2"), the second page is written. Therefore, a threshold voltage distribution of the cell is as shown in FIG. 1C. In order to judge data in such a cell, setting a potential of a word line to "b" to perform a read operation can suffice. However, a result of executing the read operation with the word line potential "b" has been already read out to the data storage circuit 10. Therefore, it is good enough to output data stored in the data storage circuit 10 to the outside (S43).

On the other hand, if data read out from the second flag cell FC2 is "1" (data in a memory cell is "0"), the second page is not written. Therefore, a threshold voltage distribution of the cell is as shown in FIG. 1A or B. In order to judge data in such a memory, a potential of a word line is set to "a" to perform a read operation (S44). The data is read out to the data storage circuit 10 in this manner. Thereafter, the data read out to the data storage circuit 10 is output to the outside (S43).

(Second Page Read Operation)

Figure 16:
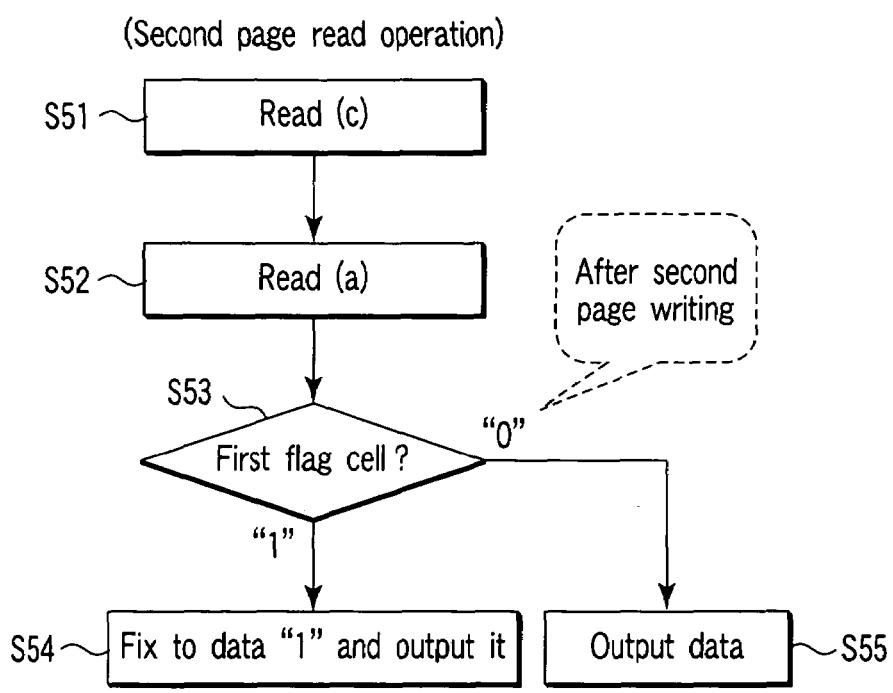
FIG. 16 is a flowchart showing a second page read operation.

FIG. 16 shows a flowchart of a second page read operation. In the second page read operation, an address is first specified, and two pages shown in FIG. 4 are selected. As shown in FIGS. 1B and 1C, a threshold voltage distribution varies before and after writing a second page. However, such a threshold voltage distribution as shown in FIG. 1E is obtained after writing the second page. Therefore, a potential of a word line must be changed twice to "c" and "a" to carry out a read operation.

First, a word line potential is set to "c" to execute the read operation (S51). Then, the word line potential is set to "a" to perform the read operation (S52). When a threshold voltage of a cell is lower than the word line potential "a" or higher than the word line potential "c", data is set to "1". When the threshold voltage of the cell is higher than the word line potential "a" and lower than the word line potential "c", the data is set to "0". "1" should be output as the second page data before writing the second page. However, the threshold voltage distribution shown in FIG. 1A is obtained. Therefore, when the same read operation as that after writing the second page is executed, the output data may become "0". Therefore, whether data in a first flag cell FC1 is "0" or "1" is judged (S53). As a result, when the data in the first flag cell FC1 is "1" and the second page is not written, the output data is fixed as "1" (S54). Furthermore, when the data in the flag cell is "0", the read-out data is output (S55).

The data is read from the memory cell in accordance with the sequences depicted in FIGS. 15 and 16. However, as described above, when the power supply is turned off during writing the second page and the second page data is not normally written, the first page data read out from the memory cell may be incorrect. Thus, an operation when reading the first page data will now be described.

(Read Procedure)

Figure 17:
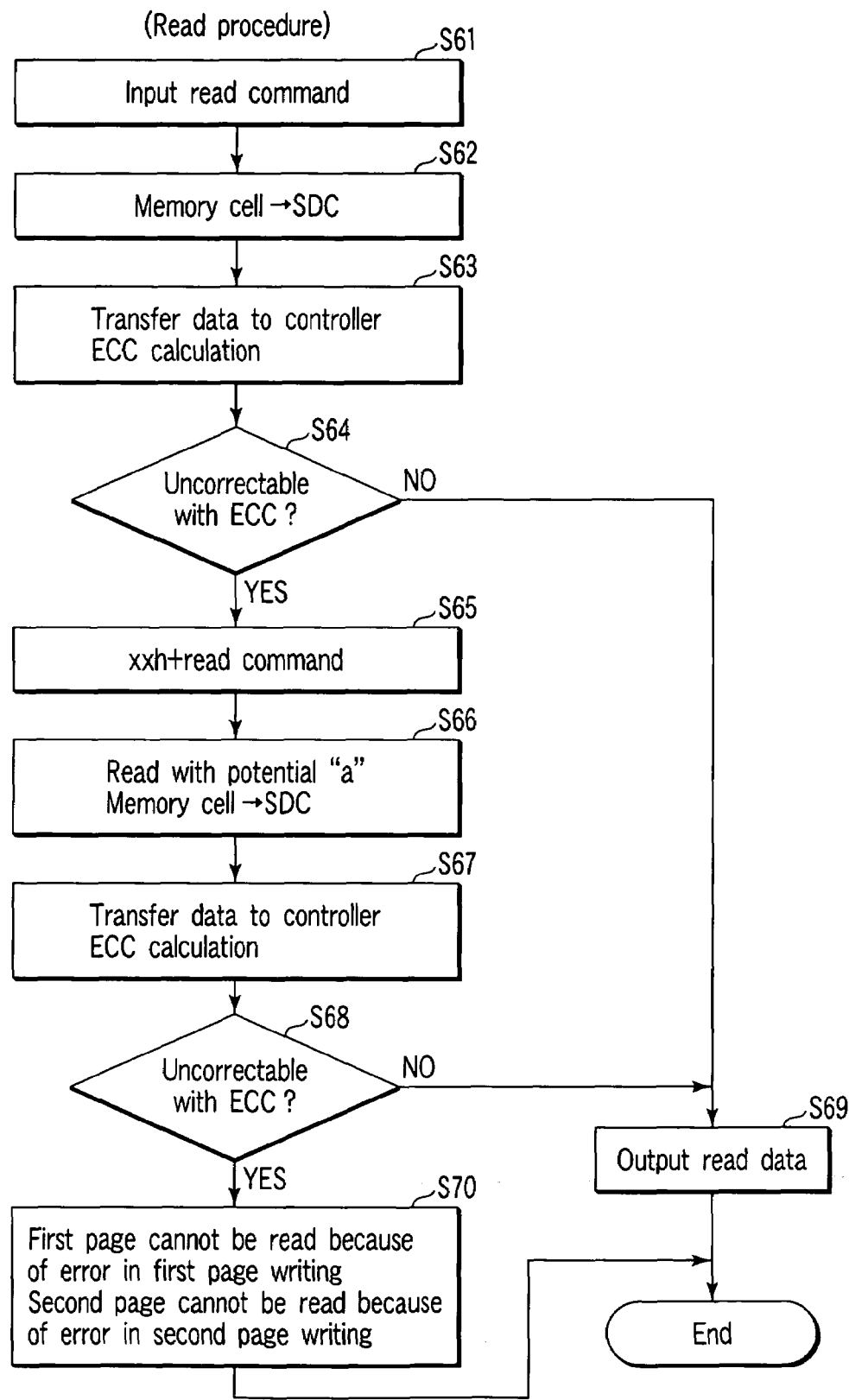
FIG. 17 is a flowchart showing a read procedure on a user side.

FIG. 17 is a flowchart showing a read procedure from a user side. For example, a read command is input to a NAND flash memory via a controller 9 depicted in FIG. 3 from a non-illustrated user-side controller (S61). As a result, data in a memory cell according to an address is read and transferred to the SDC (S62). Then, data read to the controller 9 from the NAND flash memory is sequentially transferred. The controller 9 executes a calculation to decode an ECC (S63). After all data are transferred, the controller 9 judges whether there is an error in the data or such an error can be corrected by using the ECC (S64). When there is no error or such an error can be corrected by using the ECC, the read-out data is normal. When the error cannot be corrected by using the ECC, there is a possibility that abnormal terminal has occurred during the write operation. Write defects have been conventionally classified into the following three types.

(1) An error has occurred during writing the first page, and the first page data cannot be read out.

(2) An error has occurred during writing the second page, and the first page data cannot be read out.

(3) An error has occurred during writing the second page, and the second page data cannot be read out.

Since a cell which is being subjected to the write operation has an error in (1) and (3), the read operation is of course impossible. The first embodiment remedies the case of (2). That is, destruction of the first page data is avoided so that reading the first page data is enabled.

In the first embodiment, results on the respective write stages can be classified as follows.

(1) Writing the first page (a flag cell: kept in an erased state)

In the case of a write failure in a main body cell (a cell other than the first and second flag cells and the ECC cell)

First page read failure by a regular read operation (a word line potential "a")

First page read failure by using a special command and a word line potential "a"

In the case of successful writing in the main body cell

Successful first page reading by the regular reading (a word line potential "a")

Successful first page reading by using a special command and a word line potential "a"

(2) Writing data in an adjacent cell (3) First step of writing the second page (the second flag cell FC2→a potential "b")

In the case of a write failure in the second flag cell FC2 and a write failure in the main body cell Successful first page reading by the regular reading (a word line potential "a")

Successful first page reading by using a special command and a word line potential "a"

In the case of successful data writing in the second flag cell FC2 and a write failure in the main body cell A first page read failure by the regular reading (a word line potential "b")

Successful first page reading using special command and a word line potential "a"

In the case of a write failure in the second flag cell FC2 and successful writing in the main body cell Successful first page reading by the regular reading (a word line potential "a")

Successful first page reading by using a special command and a word line potential "a"

In the case of successful writing in the second flag cell FC2 and successful writing in the main body cell Successful first page reading by the regular reading (a word line potential "b")

Successful first page reading by using a special command and a word line potential "a"

(4) Second step of writing the second page (the second flag cell FC2, a potential "b" unchanged)

Successful first page reading by the regular reading (a word line potential "b")

A first page read failure of by using a special command and a word line potential "a".

In the above-described relationship, when the first step of the second page program operation is interrupted, the read operation is executed with the word line potential "b" in the case of successful writing in the second flag cell FC2 and a write failure in the main body cell. Therefore, the read operation fails since a threshold voltage of the main body cell does not reach the potential "b".

Accordingly, in this case, as shown at a step S65 in FIG. 17, a special read command (xxh+a read command) is supplied from the outside irrespective of data in the flag cell. The read operation is executed with the word line potential "a" in response to this special command (S66). Data read out from the memory cell to the SDC is sequentially transferred to the controller 9. The controller 9 performs a calculation to decode the ECC (S67).

After all data are transferred to the controller 9, whether there is an error or such an error can be corrected by using the ECC is judged (S68). As a result, when there is no error or such an error can be corrected by the ECC, the read-out data is output (S69). Moreover, when an error cannot be corrected by using the ECC, the error is regarded as an error caused due to (1) or (3) or deterioration in the cell due to leaving or the like, and hence the data cannot be read out (S70).

(Erase Operation)

In an erase operation, an address is first specified, and a block indicated by a broken line in FIG. 4 is selected. When the erase operation is carried out, data in a memory cell becomes "0", data "1" is output irrespective of a read operation effected in both a first page and a second page.

According to the first embodiment, in a write operation of the second page, data is written in an adjacent cell after the first page is written, data "2" having an expanded threshold voltage distribution is set to an original threshold voltage, and then other data is written. Therefore, even if an error is generated in the second page writing, it is possible to prevent the data "0" or "2" written in the first page writing from being destructed. Accordingly, the first page data can be read out.

It is to be noted that a write speed is lowered when the second page writing is carried out on two stages, i.e., the first step and the second step. Therefore, in case of a user who allows destruction of the first page and wants to perform a write operation at a high speed, the write operation of the memory cell data "2" and the verify operation "b" on the first step are not executed, but the write operation may be carried out on the second step. In case of such a user, for example, another write command may be set, or data for this user may be set in the fuse circuit 7-1 provided in the control signal and control voltage generator circuit 7 to allow switching.

FIG. 13B shows data in each data cache when the first step of the second page write operation is eliminated.

Additionally, conditions adopted for the write operation and the read operation according to the first embodiment may be set as follows, for example.

A case where the power supply is cut off after the first page writing, and then the power supply is again turned on to perform the second page writing.

A case where continuous writing of the first page and the second page and discontinuous writing of the same are switched by using a command.

A case where a user wants to prevent the first page data from being destroyed. In this case, when the write method and the read method according to the first embodiment are previously set by using the fuse circuit 7-1, a new command does not have to be input.

Second Embodiment

According to the first embodiment, in the second page writing, the data "0" to "1" of the memory cell are written in the first flag cell FC1, and the data "0" to "2" of the memory cell are written in the second flag cell FC2. However, when a threshold voltage distribution of the second flag cell FC2 shown in FIG. 1C is lower than a threshold voltage "c", the first flag cell FC1 can be eliminated.

Figure 18:
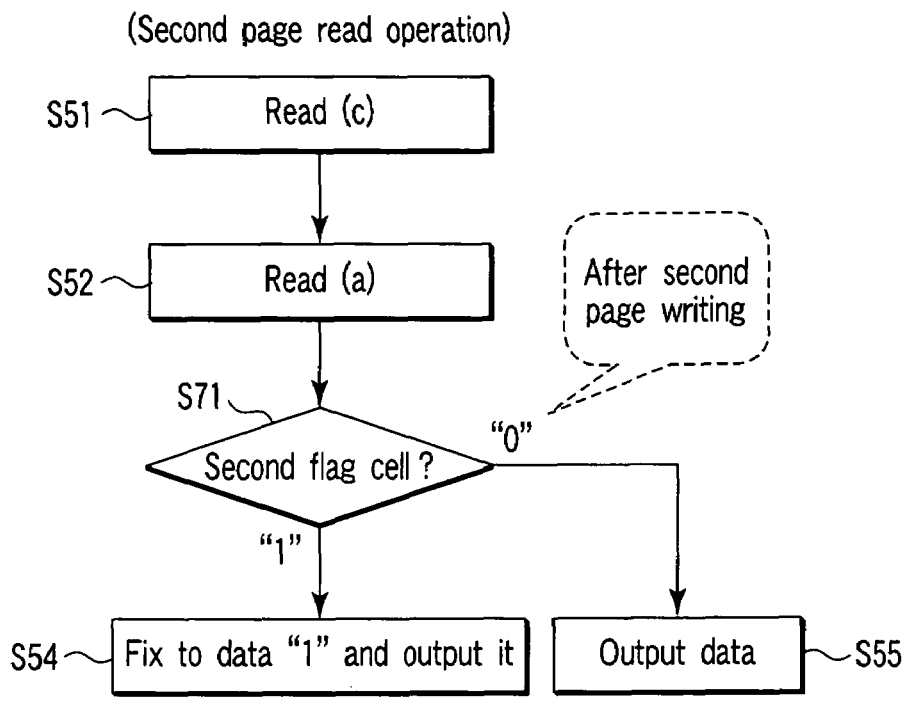
FIG. 18 is a flowchart showing a read sequence of a second page in a second embodiment.

FIG. 18 shows a read sequence of a second page in the second embodiment. Like reference numerals denote parts equal to those in the first embodiment. In the case of the second embodiment, when discriminating output data, data in the second flag cell FC2 is used in place of that in the first flag cell FC1 (S71).

The second embodiment can obtain the same effects as those of the first embodiment. Furthermore, since the first flag cell FC1 can be eliminated in the second embodiment, a configuration can be simplified.

Third Embodiment

According to the first embodiment, in the second page writing, the data "0" to "1" of the memory cell are writing in the first flag cell FC1, and the data "0" to "2" of the memory cell are written in the second flag cell FC2. However, as the write sequence of the memory cell, there are writing of the data "0" to "1" and writing of the data "2" to "3" alone. Therefore, writing data in the second flag cell FC2 may obstruct an increase in a write speed in some cases. Thus, the first flag cell FC1 only is used without utilizing the second flag cell FC2.

In this case, data is written in the first flag cell alone in a second page program operation. A second page read sequence is as shown in FIG. 16.

Figure 19:
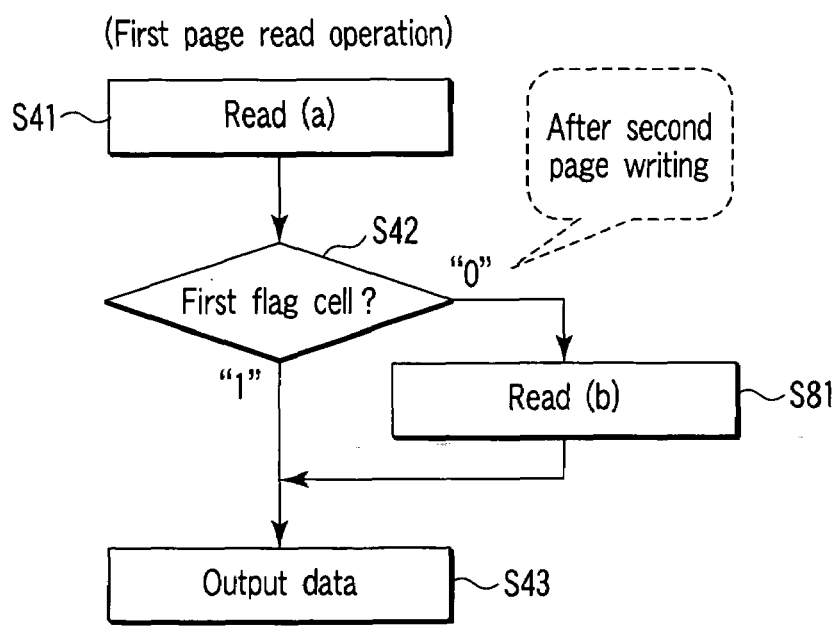
FIG. 19 is a flowchart showing a read sequence of a first page in a third embodiment.

FIG. 19 is a flowchart showing a read sequence of a first page in the third embodiment, and like reference numerals denote parts equal to those in FIG. 15. In the first page reading, data is first read at a read level "a" (S41). If it is determined that data has been written in the first flag cell FC1 as a result of a judgment on the first flag cell FC1 (S42), data of the second page has been written. Therefore, data is again read at a read level "b" (S81). Moreover, when the first flag cell FC1 has no data written therein, data of the second page is not written. Therefore, a result of reading data at the read level "a" is output (S43).

(Read Procedure)

A read procedure by a user is as shown in FIG. 17. However, a relationship between the first page reading, the first flag cell FC1 and the main body cell is as described below.

(1) First page (the flag cell remains in an erased state)
   In the case of a write failure in the main body cell
      A first page read failure by a regular read operation (a word line potential "a")
      A first page read failure by using a special command and a word line potential "b"
   In the case of successful writing in the main body cell
      Successful first page reading by the regular read operation (a word line potential "a")
      A first page read failure using a special command and a word line potential "b"

(2) Writing data in an adjacent cell (3) First step of writing data of the second page (the first flag cell FC1 remains in the erased state)
   In the case of a write failure in the main body cell
      Successful first page reading by the regular read operation (a word line potential "a")
   In the case of successful writing in the main body cell
      Successful first page reading by the regular read operation (a word line potential "a")

(4) Second step of writing data of the second page (data is written in the first flag cell FC1 with a potential "a")
   In the case of a write failure in the first flag cell FC1
      A first page read failure by the regular reading (a word line potential "a")
      Successful first page reading by using a special command and a word line potential "b"
   In the case of successful writing in the first flag cell FC1
      Successful first page reading by the regular reading (a word line potential "b")
      Successful first page reading by using a special command and a word line potential "b"

At the second step of writing of the second page, when the first flag cell FC1 has a write failure, the read operation is executed with the word line potential "a". Data of the first page is written with the potential "b" or above at the first step. However, at the second step, there is a possibility that data of the second page is written with the potential "a" or above. Therefore, reading data with the word line potential "a" results in a failure.

Accordingly, in this case, as indicated at a step 65 in FIG. 17, a special command is supplied to the NAND flash memory from the outside, and the read operation is executed with the word line potential "b" irrespective of the flag cell.

According to the third embodiment, data is written by using the first flag cell FC1 alone without utilizing the second flag cell FC2. Therefore, the write operation of the second page can be increased. Moreover, even if an error has occurred in the second page write operation, data of the first page can be read out. Therefore, the reliability of the semiconductor memory device can be improved.

Fourth Embodiment

According to the first, second and third embodiments, as shown in FIG. 10, the second page write operation is executed in the order of the first step and the second step. However, when the write operation in an adjacent cell shown in FIG. 1B is terminated, data can be written to achieve a level "b'" before data of the second page is determined.

Therefore, data "2" can be continuously written with up to an original threshold voltage "b'" after the write operation in a last adjacent cell. Alternatively, a new different command can be supplied from the outside and the data "2" can be written with up to the original threshold voltage "b'" in response to this command after the write operation in the last adjacent cell.

According to the fourth embodiment, since the data "2" can be written to achieve the original threshold voltage "b'" before the second page data is determined, a speed of the entire write operation can be increased. In the first, second and third embodiments, a speed of writing the first page data is much higher than a speed of writing the second page data, and hence it is unbalanced. However, in the case of the fourth embodiment, the speed of writing the second page data can be increased, whereby the speed of writing data in the first page can be substantially equal to that in the second page.

Fifth Embodiment

According to the first to fourth embodiments, in writing data in the second page, data of the first page is written with a potential "b'" or above at the first step, and then a write operation is performed with an erase cell with a potential "a'" based on write data of the second page. This operation prevents a threshold voltage distribution of the first page data from overlapping a counterpart of the second page data. However, data is written in the flag cell at the first step or the second step like the write operation in the main body cell. Therefore, when a remedy using an ECC cannot be performed in a read sequence, a read operation is carried out by using a special read command.

However, for example, the first page data is written to achieve the potential "b'" at the first step of the second page writing, and then data is written in the flag cell at the second step. Subsequently, at the third step, data is written with the potential "a'" from an erase cell based on the write data of the second page. When such an operation is effected, it is possible to prevent a threshold voltage distribution of the first page data from overlapping a counterpart of the second page data. Additionally, performing the read operation in accordance with data in the flag cell can read out data of the first page without using the ECC.

For example, in a case where the first flag cell FC1 alone is used like, e.g., the third embodiment, when the write operation is interrupted due to cutoff of the power supply or the like during the write operation of the second page, a relationship between the first page reading, the first flag cell FC1 and the main body cell becomes as follows.

(1) First page (the first flag cell remains in an erased state)
   In the case of a write failure in the main body cell
      A first page read failure by a regular read operation (a word line potential "a")
   In the case of successful writing in the main body cell
      Successful first page reading by the regular read operation (a word line potential "a")

(2) Writing in an adjacent cell (3) First step of writing the second page (the first flag cell FC1 remains in the erased state, data is written in the main body cell to achieve a potential "b'")
   In the case of a write failure in the main body cell
      Successful first page reading by the regular read operation (a word like potential "a")
   In the case of successful writing data in the main body cell
      Successful first page reading by the regular read operation (a word line potential "a")

(4) Second step of writing the second page (data is written in the first flag cell FC1 to achieve a potential "a" or a threshold voltage higher than a threshold voltage in an erased state)

In the case of a write failure in the first flag cell FC1
Successful first page reading by the regular read operation (a word line potential "a")
In the case of successful writing in the first flag cell FC1
Successful first page reading by the regular read operation (a word line potential "b")

(5) Third step of writing the second page (data is written in the main body cell with a potential "a'")
In the case of a write failure in the main body cell
Successful first page reading by the regular read operation (a word line potential "b")
In the case of successful writing in the main body cell
Successful first page reading by the regular read operation (a word line potential "b")

As described above, according to the fifth embodiment, data is written in the first flag cell FC1 to achieve the potential "a" at the second step of the write operation in the second page. Setting the word line potential "a" or "b" can read data in the first page irrespective of a failure or a success in writing data in the first flag cell FC1. Therefore, data of the first page can be read out without using an ECC. Accordingly, data can be read without waiting in a calculation time required for decoding of the ECC, thereby enabling high-speed reading.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
a memory cell array in which a plurality of memory cells are arranged in a matrix form, each memory cell being connected with a word line and a bit line and storing n values (n is a natural number which is not smaller than 3);
a write section which writes n-valued data in the memory cell having k values (k<n) stored therein;
a read section which sets a potential of the word line and reads data from the memory cell in the memory cell array; and
a control section which changes the potential of the word line supplied to the read section at the time of reading the k-valued data when data read by the read section includes an uncorrectable error.

2. The device according to claim 1, wherein the memory cell array has a storage region which stores an error correction code.

3. The device according to claim 1, wherein the control section operates the read section in response to a first read command, and operates the read section in response to a second read command different from the first read command when the data read by the read section includes the uncorrectable error.

4. A semiconductor memory device comprising:
a memory cell which stores n values (n is a natural number which is not smaller than 3); and
a control section which controls the memory cell,
wherein the control section controls to set a threshold voltage of the memory cell from a first threshold voltage to the first threshold voltage or a second threshold voltage (the first threshold voltage<the second threshold voltage) by a first write operation, set the threshold voltage of the memory cell to a third threshold voltage (the second threshold voltage≦the third threshold voltage) or above by a second write operation when the threshold voltage of the memory cell is the second threshold voltage, and set the threshold voltage of the memory cell to the first threshold voltage or a fourth threshold voltage (the first threshold voltage<the fourth threshold voltage) by a third write operation when the threshold voltage of the memory cell is the first threshold voltage.

5. The device according to claim 4, further comprising a flag memory cell,
wherein the control section performs writing to set a threshold voltage of the flag memory cell selected simultaneously with the memory cell from the first threshold voltage to the third threshold voltage or above by the second write operation.

6. The device according to claim 4, wherein the control section performs a read operation as to whether a threshold voltage of the memory cell is equal to or greater than the third threshold voltage in a first read operation, and performs read operation as to whether the threshold voltage of the memory cell is equal to or greater than the second threshold voltage, when data read by the first read operation includes an uncorrectable error.

7. The device according to claim 4, further comprising a flag memory cell,
wherein the control section performs writing to set a threshold voltage of the flag memory cell selected simultaneously with the memory cell from the first threshold voltage to the fourth threshold voltage or above by the third write operation.

8. The device according to claim 7, wherein the control section reads a threshold voltage of the memory cell in which data has been written by the third write operation, outputs data corresponding to the read threshold voltage when the threshold voltage of the flag memory cell is not smaller than the fourth threshold voltage, and outputs fixed data when the threshold voltage of the flag memory cell is lower than the fourth threshold voltage.

9. The device according to claim 7, wherein the control section performs a read operation as to whether a threshold voltage of the memory cell is equal to or greater than the fourth threshold voltage in the first read operation, and performs a read operation as to whether the threshold voltage of the memory cell is equal to or greater than the third threshold voltage, when data read by the first read operation includes an uncorrectable error.

10. The device according to claim 4, further comprising a flag memory cell,
wherein the control section sets a threshold voltage of the flag memory cell selected simultaneously with the memory cell from the first threshold voltage to the third threshold voltage or the fourth threshold voltage or above (the first threshold voltage<the fourth threshold voltage) by the third write operation, and performs writing to set the threshold voltage of the memory cell to the first threshold voltage or the fourth threshold voltage when the threshold voltage of the memory cell is the first threshold voltage.

11. The device according to claim 4, wherein the control section sets the threshold voltage of the memory cell to the third threshold voltage (the second threshold voltage≦the third threshold voltage) or the fourth threshold voltage (the third threshold voltage<the fourth threshold voltage) by the second write operation when the threshold voltage of the memory cell is the second threshold voltage, and performs writing to set the threshold voltage of the memory cell to the first threshold voltage or a fifth threshold voltage (the first threshold voltage<the fifth threshold voltage<the third threshold voltage) by the third write operation when the threshold voltage of the memory cell is the first threshold voltage.

12. The device according to claim 4, wherein the control section sets the threshold voltage of the memory cell to the third threshold voltage (the second threshold voltage≦the third threshold voltage) by the second write operation when the threshold voltage of the memory cell is the second threshold voltage, sets the threshold voltage of the memory cell to the third threshold voltage or the fifth threshold voltage (the third threshold voltage<the fifth threshold voltage) by the third write operation when the threshold voltage of the memory cell is the third threshold voltage, and performs writing to set the threshold voltage of the memory cell to the first threshold voltage or the fourth threshold voltage (the first threshold voltage<the fourth threshold voltage<the third threshold voltage) when the threshold voltage is the first threshold voltage.

13. The device according to claim 4, wherein the control section performs writing to set the threshold voltage of the memory cell to the third threshold voltage in response to a command after the first write operation.

14. A semiconductor memory device comprising:
a memory cell which stores n values (n is a natural number which is not smaller than 3);
a first flag memory cell;
a second flag memory cell; and
a control section which controls the memory cell and the first and second flag memory cells,
wherein the control section sets a threshold voltage of the memory cell from a first threshold voltage to the first threshold voltage or a second threshold voltage (the first threshold voltage<the second threshold voltage) by a first write operation, sets the threshold voltage of the memory cell to a third threshold voltage (the second threshold voltage≦the third threshold voltage) or above and performs writing to set the third threshold voltage in the second flag memory cell by a second write operation when the threshold voltage of the memory cell is the second threshold voltage, performs writing to set the threshold voltage of the memory cell to the first threshold voltage or a fourth threshold voltage (the first threshold voltage<the fourth threshold voltage) by a third write operation when the threshold voltage of the memory cell is the first threshold voltage, and performs writing to set one of the third threshold voltage and a fifth threshold voltage (the third threshold voltage<the fifth threshold voltage) in the memory cell and writes the fourth threshold voltage in the first flag memory cell when the threshold voltage of the memory cell is the third threshold voltage.

15. The device according to claim 14, wherein the control section performs a first read operation as to whether a threshold voltage of the memory cell is equal to or greater than the third threshold voltage, performs a second read operation as to whether the threshold voltage of the memory cell is equal to or greater than the fourth threshold voltage, and outputs a data read by the second read operation when the read data has no error or has a correctable error.

16. The device according to claim 14, wherein the first flag memory cell is not used when a threshold voltage of the second flag cell is lower than the third threshold voltage, and
the control section reads a threshold voltage of the memory cell written by the second and third write operations, outputs data corresponding to the read threshold voltage when the threshold voltage of the second flag memory is not smaller than the fourth threshold voltage, and outputs fixed data when the threshold voltage of the second flag memory cell is smaller than the fourth threshold voltage.

17. The device according to claim 14, wherein the control section does not perform writing in the second flag memory cell in the second write operation, performs the first read operation to determine whether the threshold voltage of the memory cell is equal to or greater than the fourth threshold voltage, performs the second read operation to determine whether the threshold voltage of the memory cell is equal to or greater than the third threshold voltage and outputs a result, when data has been written in the first flag memory cell, and outputs a result of the determination made in the first read operation, when data has not been written in the first flag memory cell.

18. The device according to claim 14, wherein the control section performs writing to set the threshold voltage of the memory cell to the third threshold voltage in response to a command after the first write operation.

19. The device according to claim 14, wherein the control section sets a threshold voltage of the first flag memory cell selected simultaneously with the memory cell from the first threshold voltage to the fourth threshold voltage (the first threshold voltage<the fourth threshold voltage) or above by the third write operation, and performs writing to set the threshold voltage of the memory cell to the first threshold voltage or the fourth threshold voltage by a fourth write operation when the threshold voltage of the memory cell is the first threshold voltage.

20. The device according to claim 15, wherein the memory cell is included in the memory cell array, and the memory cell array has a storage region in which an error correction code is stored.

* * * * *